(12) United States Patent
Lee et al.

(10) Patent No.: US 12,349,607 B2
(45) Date of Patent: Jul. 1, 2025

(54) SEMICONDUCTOR DEVICES WITH A DOUBLE SIDED WORD LINE STRUCTURE

(71) Applicant: Taiwan Semiconductor Manufacturing Co., Ltd., Hsinchu (TW)

(72) Inventors: Tung-Ying Lee, Hsinchu (TW); Shao-Ming Yu, Zhubei (TW); Cheng-Chun Chang, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/447,232

(22) Filed: Aug. 9, 2023

(65) Prior Publication Data

US 2023/0389452 A1 Nov. 30, 2023

Related U.S. Application Data

(62) Division of application No. 17/332,135, filed on May 27, 2021, now Pat. No. 11,856,876.

(60) Provisional application No. 63/166,325, filed on Mar. 26, 2021.

(51) Int. Cl.
*H10N 70/00* (2023.01)
*G11C 7/18* (2006.01)
*G11C 8/14* (2006.01)
*H10B 63/10* (2023.01)

(52) U.S. Cl.
CPC ............. *H10N 70/826* (2023.02); *G11C 7/18* (2013.01); *G11C 8/14* (2013.01); *H10N 70/021* (2023.02); *H10N 70/068* (2023.02); *H10B 63/10* (2023.02)

(58) Field of Classification Search
CPC .. H10N 70/826; H10N 70/021; H10N 70/068; H10N 70/20; H10N 70/823; H10N 70/8833; H10N 70/061; G11C 7/18; G11C 8/14; H10B 63/10; H10B 63/80; H10B 63/24; H10B 63/84
See application file for complete search history.

(56) References Cited

U.S. PATENT DOCUMENTS

| | | | |
|---|---|---|---|
| 8,351,243 B2 | 1/2013 | Mihnea et al. | |
| 9,608,077 B1 | 3/2017 | Kye et al. | |
| 2009/0200536 A1 | 8/2009 | Van Schaijk et al. | |
| 2009/0321878 A1 | 12/2009 | Koo et al. | |
| 2014/0264244 A1 | 9/2014 | Hong et al. | |
| 2015/0129827 A1* | 5/2015 | Chen | H10N 70/841 257/4 |
| 2015/0263073 A1 | 9/2015 | Lin | |
| 2017/0005138 A1 | 1/2017 | Kim | |
| 2018/0083188 A1 | 3/2018 | Tu et al. | |

(Continued)

FOREIGN PATENT DOCUMENTS

| | | |
|---|---|---|
| DE | 102018127048 A1 | 5/2019 |
| JP | 2010205853 A | 9/2010 |

(Continued)

*Primary Examiner* — Jerome Leboeuf
(74) *Attorney, Agent, or Firm* — Slater Matsil, LLP

(57) ABSTRACT

Semiconductor devices and methods of manufacturing the same are provided in which memory cells are manufactured with a double sided word line structure. In embodiments a first word line is located on a first side of the memory cells and a second word line is located on a second side of the memory cells opposite the first side.

20 Claims, 21 Drawing Sheets

(56) References Cited

U.S. PATENT DOCUMENTS

| | | |
|---|---|---|
| 2019/0109178 A1 | 4/2019 | Yang et al. |
| 2019/0131348 A1 | 5/2019 | Ko |
| 2019/0157554 A1 | 5/2019 | Mo et al. |
| 2020/0006428 A1 | 1/2020 | Jiang et al. |
| 2020/0395408 A1 | 12/2020 | Takahashi et al. |
| 2020/0403035 A1 | 12/2020 | Ogiwara et al. |
| 2021/0217813 A1* | 7/2021 | Wang .................. H10N 70/063 |
| 2022/0076744 A1 | 3/2022 | Chen et al. |
| 2022/0246679 A1 | 8/2022 | Cho et al. |

FOREIGN PATENT DOCUMENTS

| | | |
|---|---|---|
| KR | 20100001260 A | 1/2010 |
| KR | 101030974 B1 | 5/2011 |
| KR | 20130107326 A | 10/2013 |
| KR | 20170028666 A | 3/2017 |
| KR | 20190048050 A | 5/2019 |
| TW | 200627453 A | 8/2006 |

\* cited by examiner

US 12,349,607 B2

SEMICONDUCTOR DEVICES WITH A DOUBLE SIDED WORD LINE STRUCTURE

PRIORITY CLAIM AND CROSS-REFERENCE

This application is a divisional of U.S. patent application Ser. No. 17/332,135, filed on May 27, 2021, entitled "Semiconductor Devices with a Double Sided Word Line Structure and Methods of Manufacture," which claims the benefit of U.S. Provisional Application No. 63/166,325, filed on Mar. 26, 2021, which applications are hereby incorporated herein by reference.

BACKGROUND

Semiconductor memories are used in integrated circuits for electronic applications, including radios, televisions, cell phones, and personal computing devices, as examples. One type of semiconductor memory is resistive random access memory (RRAM), which involves storing values in resistance changing materials. Resistance changing materials can be switched between a low resistance phase and a high resistance phase to indicate bit codes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
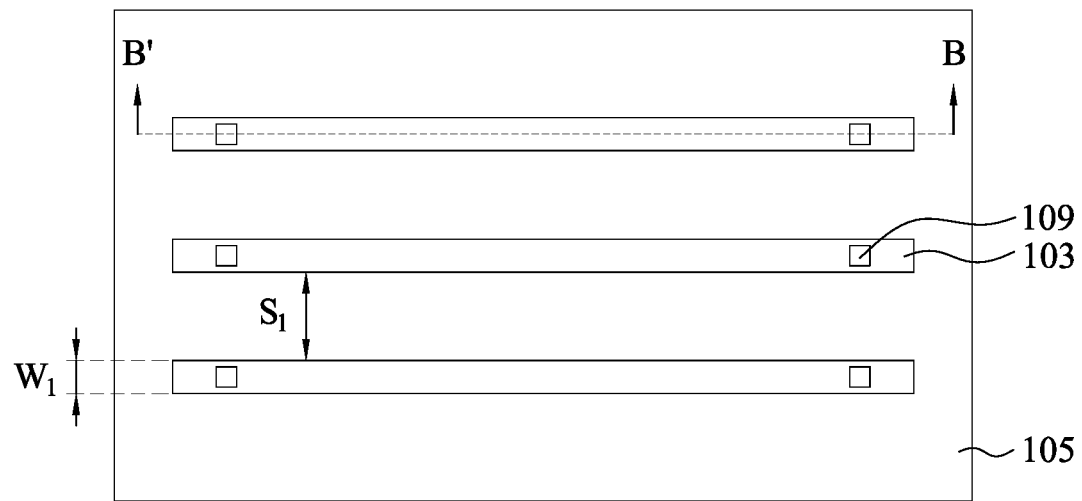
FIGS. 1A-1B illustrate formation of a first word line, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment in which resistive random access memory (RRAM) devices are connected to word lines located on opposite sides of the RRAM devices in order to provide individual bit operation capabilities of multiple functional vertical RRAM cells (in, e.g., a 1S1R structure) per bit line. The embodiments described herein, however, are intended to be illustrative, as the ideas presented may be utilized in a wide variety of embodiments, and are not intended to limit the embodiments to those that are particularly described herein.

Figure 1B:
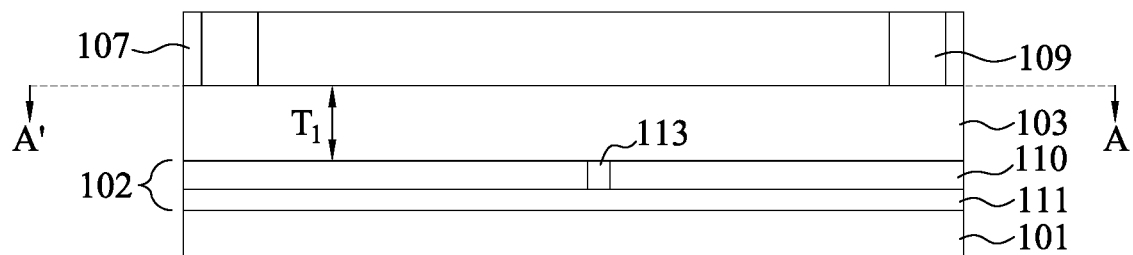

With reference now to FIGS. 1A-1B, this figure illustrates formation of a first word line 103 over a substrate 101, with FIG. 1A illustrating a top down view of the structure of FIG. 1B along line A-A' and FIG. 1B illustrating a cross-section view of FIG. 1A along line B-B'. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

In addition, the substrate 101 may include active devices (not separately illustrated) formed within and/or over the substrate 101 and first metallization layers 102 over the active devices. As one of ordinary skill in the art will recognize, a wide variety of active devices and passive devices such as transistors, capacitors, resistors, combinations of these, and the like may be used to generate the desired structural and functional requirements of the design for a semiconductor device and may be formed using any suitable methods. For example, in some embodiments the active devices may be FinFET devices, wherein fins of semiconductor materials are formed with gate stacks over fins of the FinFET devices with shallow trench isolation (STI) regions formed between fins and with source/drain regions formed within the fins on opposite sides of the gate stacks. The STI regions and source/drain regions are not separately illustrated for clarity.

The first metallization layers 102 are formed over the active devices and are designed to connect the various active devices to form functional circuitry. In an embodiment the first metallization layers 102 are formed of alternating layers of dielectric (e.g., low-k dielectric materials, extremely low-k dielectric material, ultra low-k dielectric materials, combinations of these, or the like) and conductive material and may be formed through any suitable process (such as deposition, damascene, dual damascene, etc.).

In an embodiment the first metallization layers 102 may comprise a first metal layer, a second metal layer, a third metal layer, and a fourth metal line 111 (of which only the fourth metal line 111 is illustrated for clarity). Additionally, the first metallization layers 102 comprise a dielectric layer 110 overlying the fourth metal line 111, and also includes a first metallization via 113 extending through the dielectric layer 110. However, any suitable number of metal layers, conductive layers, and vias may be utilized.

Once the substrate 101 has been presented or otherwise prepared, the first word lines 103 may be formed over the substrate 101 and in electrical connection with the first metallization via 113. In an embodiment the first word lines 103 may be formed by initially forming a first dielectric layer 105 over the substrate 101. The first dielectric layer 105 may be formed using a process such as CVD, PVD, PECVD, although other processes, such as LPCVD, may also be used. The first dielectric layer 105 may be comprised of dielectric materials such as doped or undoped silicon oxide, silicon nitride, doped silicate glass, other high-k materials, combinations of these, or the like, could be utilized. In an embodiment the first dielectric layer 105 may comprise a material such as boron phosphorous silicate glass (BPSG), although any suitable dielectrics may be used for either layer.

After formation, the first dielectric layer 105 may be planarized using, e.g., a chemical mechanical polish (CMP) process in order to planarize the first dielectric layer 105. However, any other suitable planarization process may be used to reduce the first dielectric layer 105 to the desired height and to provide a flat profile for the first dielectric layer 105.

Once the first dielectric layer 105 has been formed, the first word line 103 may be formed within the first dielectric layer 105. In an embodiment the formation of the first word line 103 may be initiated by first forming openings within the first dielectric layer 105. In an embodiment, the openings may be formed using a suitable photolithographic masking and etching process. However, any suitable process may be used to form the openings.

Once the openings have been formed in the first dielectric layer 105, a formation of a first glue layer (not separately illustrated in FIGS. 1A-1B) may be initiated. In an embodiment the first glue layer is utilized to help adhere the rest of the first word line 103 to the underlying structure and may be, e.g., titanium, titanium nitride, tantalum, tantalum nitride, molybdenum, ruthenium, rhodium, hafnium, iridium, niobium, rhenium, tungsten, combinations of these, oxides of these, or the like formed using a process such as CVD, plasma enhanced chemical vapor deposition (PECVD), physical vapor deposition (PVD), atomic layer deposition (ALD), or the like.

Once the first glue layer has been formed, the first word line 103 may be deposited to fill a remainder of the opening in the first dielectric layer 105. In an embodiment the first word line 103 may be a conductive material such as tungsten, cobalt, aluminum, nickel, copper, silver, gold, molybdenum, ruthenium, molybdenum nitride, alloys thereof, or the like, formed using a process such as CVD, plasma enhanced chemical vapor deposition (PECVD), physical vapor deposition (PVD), atomic layer deposition (ALD), or the like. However, any suitable material and method of manufacture may be utilized.

Once the material of the first word line 103 has been deposited to fill and/or overfill the opening within the first dielectric layer 105, excess material from the first glue layer and the first word line 103 located outside of the second dielectric layer 107 is removed. In an embodiment the removal process may be a planarization process, such as a chemical mechanical polishing process. However, any suitable planarization process may be utilized.

Additionally, while one particular embodiment is described above in order to illustrate how the first word line 103 can be manufactured, this description is intended to be illustrative and is not intended to be limiting. Rather, any suitable method of manufacturing may be utilized. For example, in other embodiments the material of the first word line 103 may be deposited first and then patterned using, e.g., a photolithographic masking and etching process. Once deposited and patterned, the material of the first dielectric layer 105 may then be deposited and planarized in order to help form the first word lines 103. These methods and all other suitable methods are fully intended to be included within the scope of the embodiments.

In an embodiment the first word lines 103 may be formed to have a first thickness $T_1$ of between about 80 nm and about 180 nm and may be spaced apart from each other a first spacing $S_1$ of between about 40 nm and about 80 nm. Further, the first word lines 103 may be formed to have a first width $W_1$ of between about 40 nm and about 80 nm. However, any suitable dimensions may be utilized.

Once the first word line 103 has been formed, a second dielectric layer 107 is formed over the first word line 103 and first vias 109 are formed through the second dielectric layer 107. In an embodiment the second dielectric layer 107 is formed using similar materials and similar processes as the first dielectric layer 105 described above. However, any suitable methods and materials may be utilized.

Once the second dielectric layer 107 has been formed, the first vias 109 may be formed through the second dielectric layer 107 to make connection with the first word lines 103. In an embodiment the first vias 109 may be formed using materials and processes similar to the first word line 103 (discussed above), such as forming openings in the second dielectric layer 107, filling the openings with a conductive material such as copper, and then planarizing the conductive material. However, any suitable method and material may be utilized.

Figure 2A:
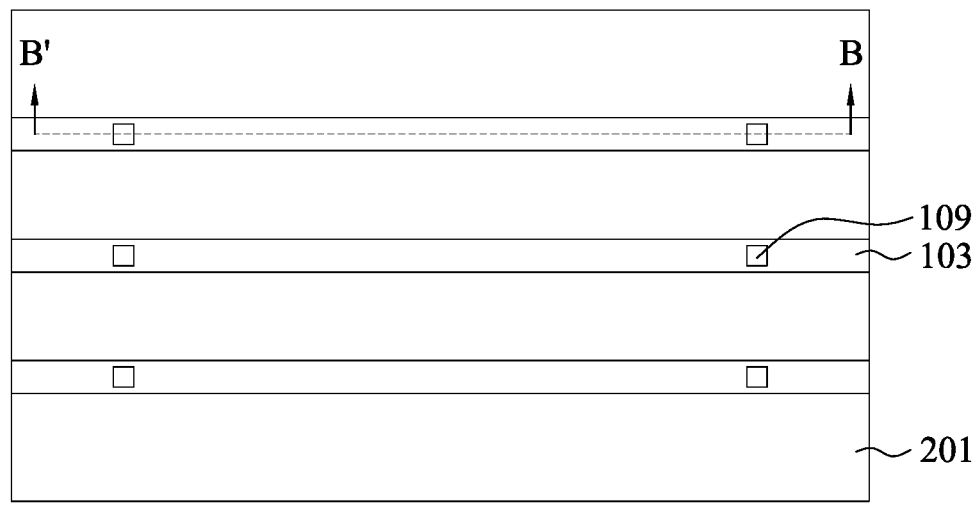
FIGS. 2A-2B illustrate formation of a bit line material, in accordance with some embodiments.
Figure 2B:
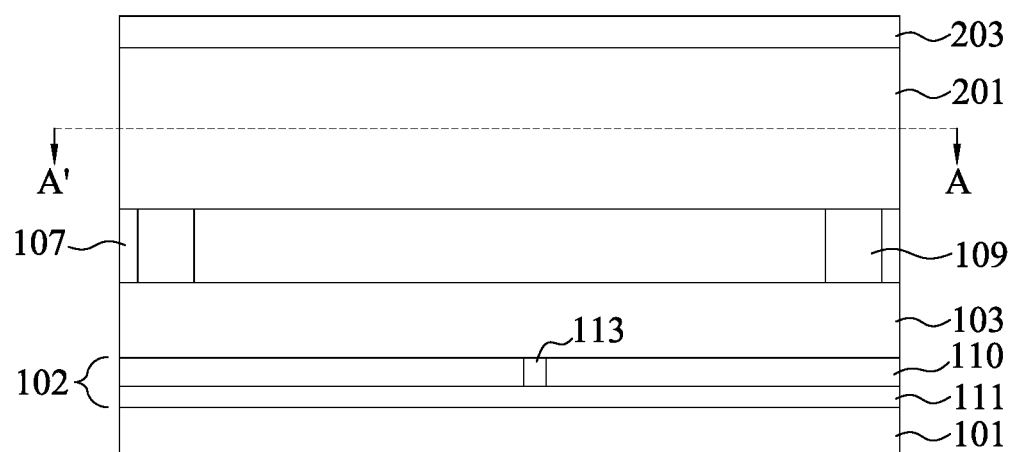

FIGS. 2A-2B illustrate deposition of a bit line material 201 material for bit lines 301 (not illustrated in FIGS. 2A-2B but illustrated and described below with respect to FIGS. 3A-3B) over and in electrical connection with the first vias 109. In these figures, FIG. 2A illustrates a top down view of FIG. 2B along line A-A' and FIG. 2B illustrates a cross-section view of FIG. 2A along line B-B'. In an embodiment the bit line material 201 may be a conductive material such as tungsten, cobalt, aluminum, nickel, copper, silver, gold, alloys thereof, or the like. The conductive material(s) may be formed by an acceptable deposition process such as ALD or CVD, an acceptable plating process such as electroplating or electroless plating, or the like. However, any suitable material and method of manufacture may be utilized.

Once the bit line material 201 has been deposited, a first hard mask 203 may be deposited over the bit line material 201. In an embodiment the first hard mask 203 may be a material such as silicon nitride, although any suitable masking materials, such as silicon oxide, silicon oxynitride, SiCON, SiC, SiOC, may also be utilized. The first hard mask 203 may be formed using a deposition process such as chemical vapor deposition or physical vapor deposition. However, any suitable process or thickness may be utilized.

Figure 3A:
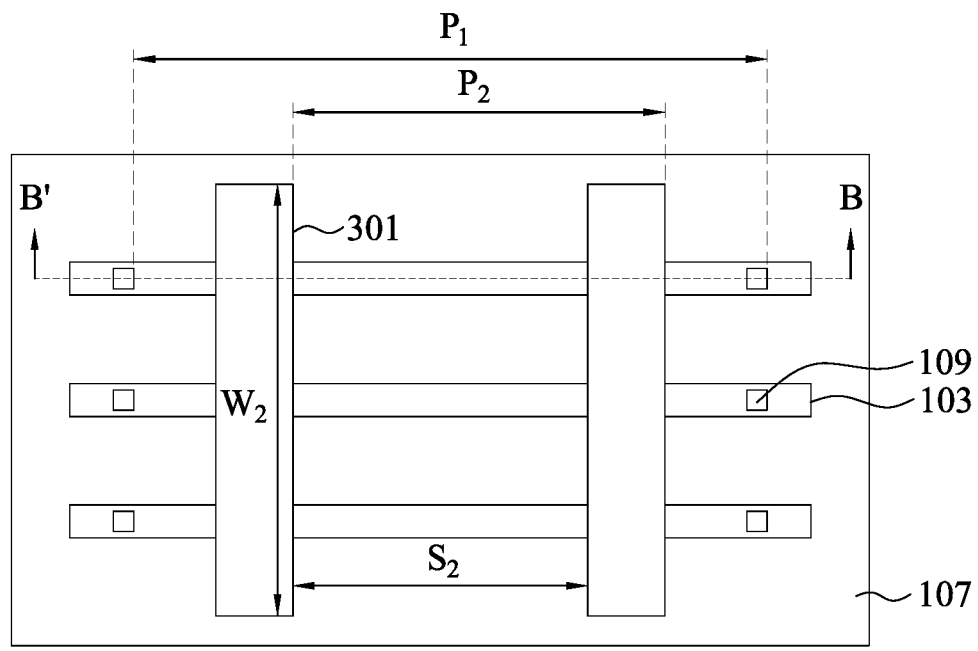
FIGS. 3A-3B illustrate formation of a bit line, in accordance with some embodiments.
Figure 3B:
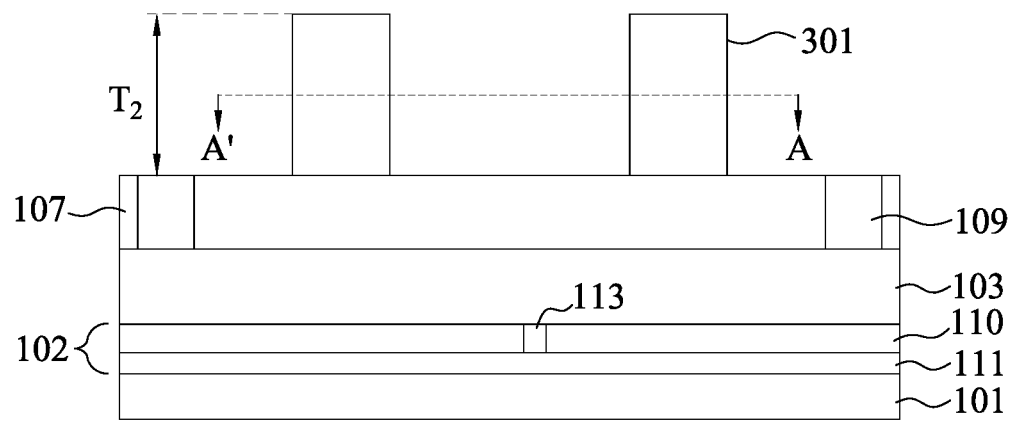

FIGS. 3A-3B illustrate a patterning of the bit line material 201 to form the bit lines 301. In these figures, FIG. 3A illustrates a top down view of FIG. 3B along line A-A' and FIG. 3B illustrates a cross-section view of FIG. 3A along line B-B'. In an embodiment, once the first hard mask 203 has been deposited over the bit line material 201, the first hard mask 203 may be patterned using, e.g., one or more photolithographic masking and etching processes. However, any suitable methods of patterning the first hard mask 203 may be utilized.

Once the first hard mask 203 has been patterned, the pattern of the first hard mask 203 may be transferred to the bit line material 201 to form the bit lines 301. In an embodiment the pattern may be transferred using one or more etching processes that utilizes the first hard mask 203 as a masking material. However, any suitable process may be utilized.

Additionally, in some embodiments once the bit lines 301 have been formed, the first hard mask 203 may be removed (if not already removed during the patterning of the bit lines 301). In some embodiments the first hard mask 203 may be removed using a wet etch process or a dry etch process, combinations of these, or the like. However, any suitable method may be utilized.

In an embodiment the bit lines 301 may be formed to have a second thickness $T_2$ of between about 80 nm and about 180 nm and may be spaced apart from each other a second spacing $S_2$ of between about 40 nm and about 80 nm. Further, the bit lines 301 may be formed to have a second width $W_2$ of between about 40 nm and about 80 nm. However, any suitable dimensions may be utilized.

Finally, by utilizing word lines in different layers, a first pitch $P_1$ between the first vias 109 may be larger than a second pitch $P_2$ between the bit lines 301. In particular embodiments the first pitch $P_1$ may be about twice as large as the second pitch $P_2$, such as the first pitch $P_1$ being between about 160 nm and about 320 nm, while the second pitch $P_2$ may be between about 80 nm and about 160 nm. However, any suitable dimensions may be utilized.

Figure 4A:
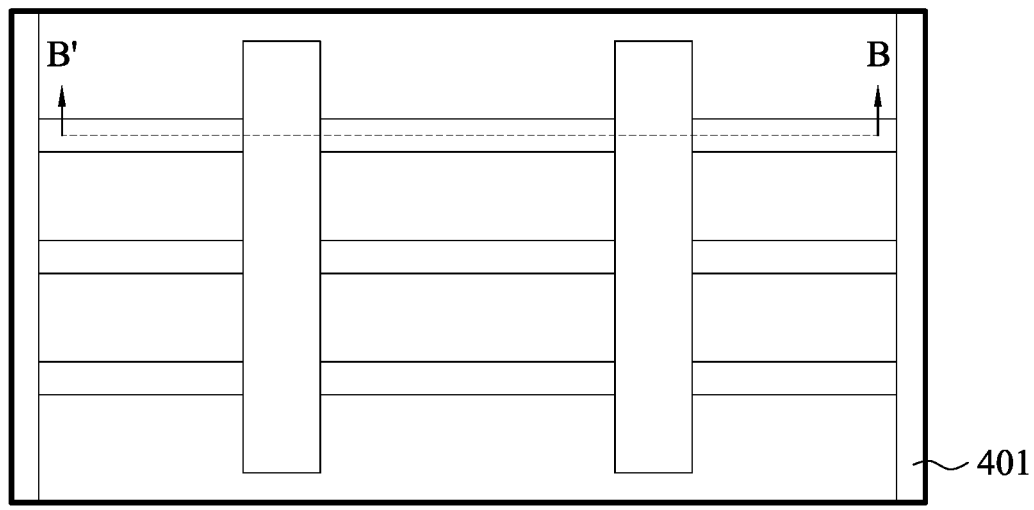
FIGS. 4A-4B illustrate formation of an RRAM material, in accordance with some embodiments.
Figure 4B:
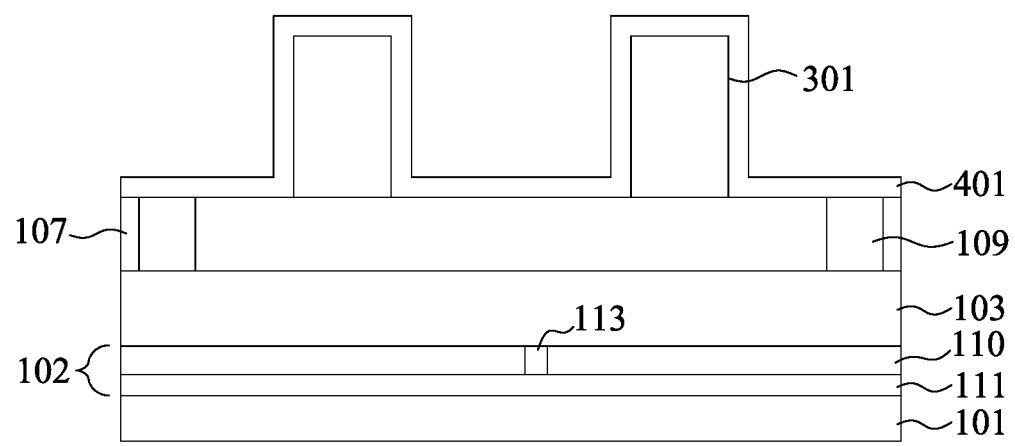

FIGS. 4A-4B illustrate deposition of an RRAM material 401 over the bit lines 301. In these figures, FIG. 4A illustrates a top down view of FIG. 4B and FIG. 4B illustrates a cross-section view of FIG. 4A along line B-B'. In an embodiment the RRAM material 401 may be formed as a conformal thin oxide film. According to some embodiments, the RRAM material 401 may be formed using one or more layers of acceptable dielectric materials suitable for storing digital values, such as hafnium oxide ($HfO_2$); hafnium zirconium oxide ($Hf_{(1-x)}Zr_xO_2$); zirconium oxide ($ZrO_2$); titanium oxide ($TiO_2$); nickel oxide (NiO); tantalum oxides ($TaO_x$); copper oxide ($Cu_2O$); niobium pentoxide ($Nb_2O_5$); aluminum oxide ($Al_2O_3$); combinations; or the like. The material of the RRAM material 401 may be formed by an acceptable deposition process such as ALD, CVD, PVD, or the like. However, any suitable method or material may be utilized.

Figure 5A:
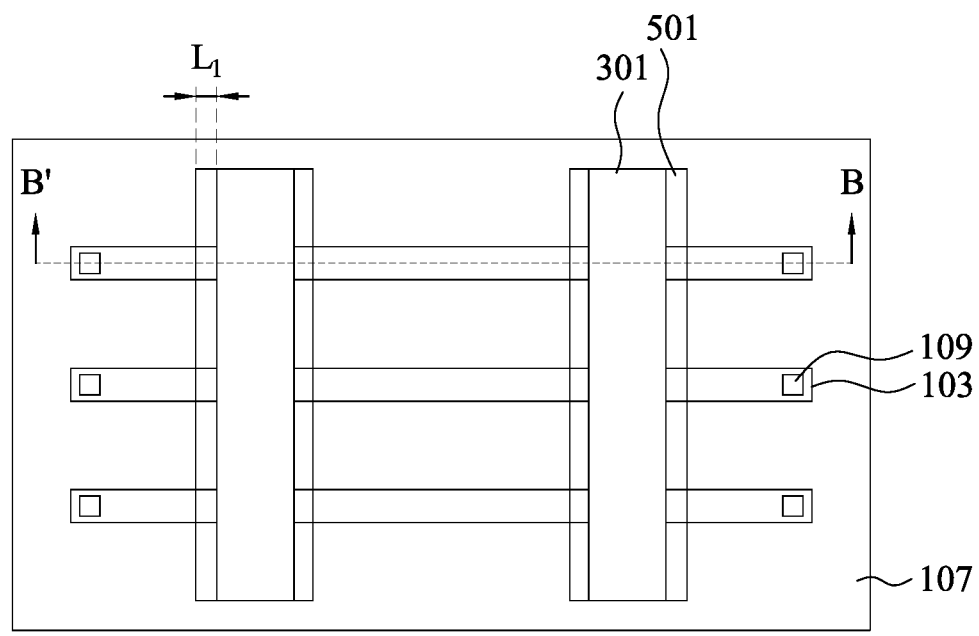
FIGS. 5A-5B illustrate patterning of the RRAM material, in accordance with some embodiments.
Figure 5B:
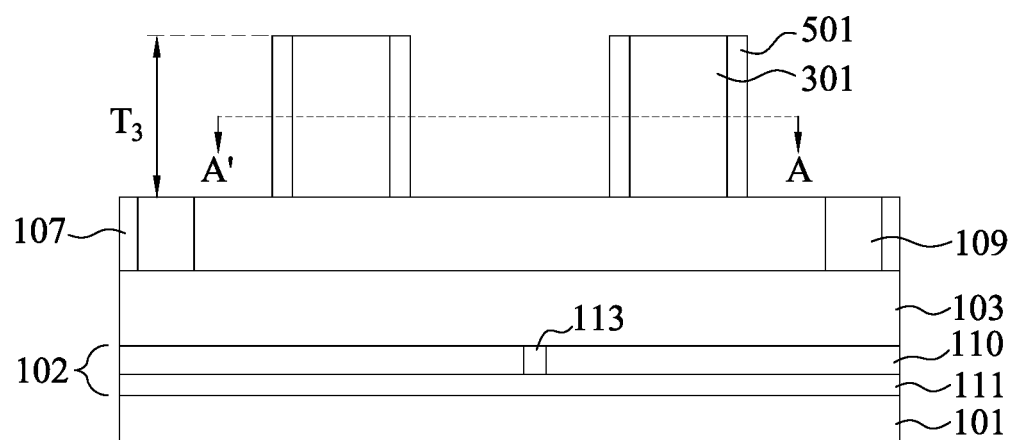

FIGS. 5A-5B illustrate a patterning of the RRAM material 401 in order to form discontinuous RRAM spacers 501 on opposite sides of the bit lines 301. In these figures, FIG. 5A illustrates a top down view of FIG. 5B along line A-A' and FIG. 5B illustrates a cross-section view of FIG. 5A along line B-B'. In an embodiment the RRAM material 401 may be patterned using an anisotropic etching process which removes horizontal portions of the RRAM material 401 while leaving behind vertical portions of the RRAM material 401 to form the RRAM spacers 501. The RRAM spacers 501 may be formed to a third thickness $T_3$ of between about 100 nm and about 180 nm, and a first length $L_1$ of between about 3 nm and about 10 nm. However, any suitable methods and thicknesses may be utilized to form the RRAM spacers 501.

Figure 6A:
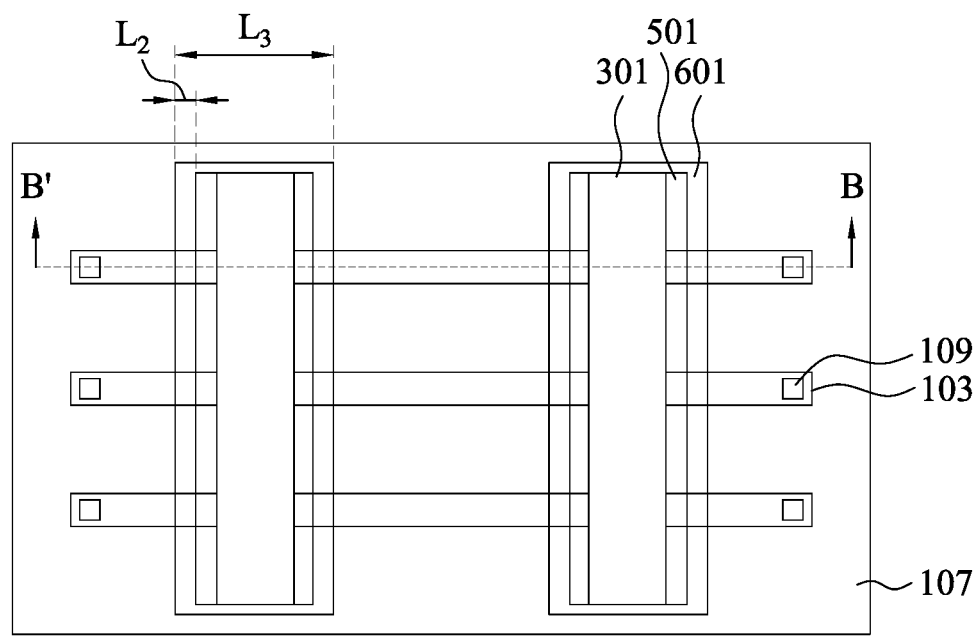
FIGS. 6A-6B illustrate formation of a selector, in accordance with some embodiments.
Figure 6B:
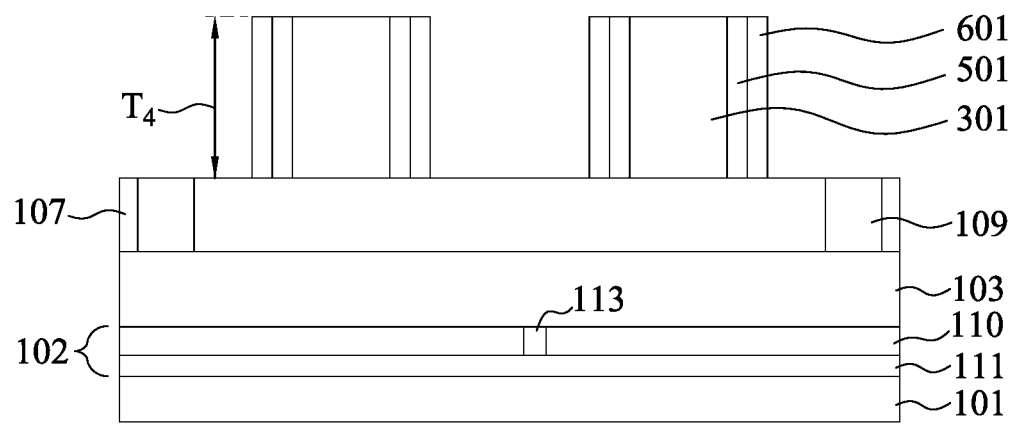

FIGS. 6A-6B illustrate formation of selectors 601 adjacent to the RRAM spacers 501. In these figures, FIG. 6A illustrates a top down view of FIG. 6B and FIG. 6B illustrates a cross-section view of FIG. 6A along line B-B'. In an embodiment the selectors 601 may be formed of ovonic threshold switching (OTS) layers, and may be formed of a chalcogenide material which includes at least a chalcogen anion (e.g., selenium (Se), tellurium (Te), and the like) and an electropositive element (e.g., germanium (Ge), silicon (Si), phosphorus (P), arsenic (As), antimony (Sb), bismuth (Bi), zinc (Zn), nitrogen (N), boron (B), carbon (C), and the like). An acceptable chalcogenide material includes, but is not limited to, $GeSb_2Te_5$ (GST). The material for the selectors 601 is conformally deposited, and may be deposited using PVD, CVD, ALD, or the like. However, any suitable material and any suitable method of deposition may be utilized.

Once the material of the selectors 601 has been deposited, the material of the selectors 601 may be patterned using one or more anisotropic etching processes (along with any suitable photolithographic masking and etching processes if desired) which remove horizontal portions of the material of the selectors 601 along the second dielectric layer 107 while leaving behind discontinuous vertical portions of the material of the selectors 601 to form the selectors 601 and also leaving behind a horizontal portion of the material of the selectors 601 along a top surface of the bit lines 301 and the RRAM spacers 501. However, any suitable methods may be utilized to form the selectors 601.

In an embodiment the selectors 601 may be formed to a fourth thickness $T_4$ of between about 100 nm and about 18 nm. Additionally, the selectors 601 may be formed to have a second length $L_2$ adjacent to the RRAM spacers 501 of between about 5 nm and about 30 nm, and a third length $L_3$ which extends over the bit lines 301 of between about 50 nm and about 120 nm. However, any suitable dimensions may be utilized.

Figure 7A:
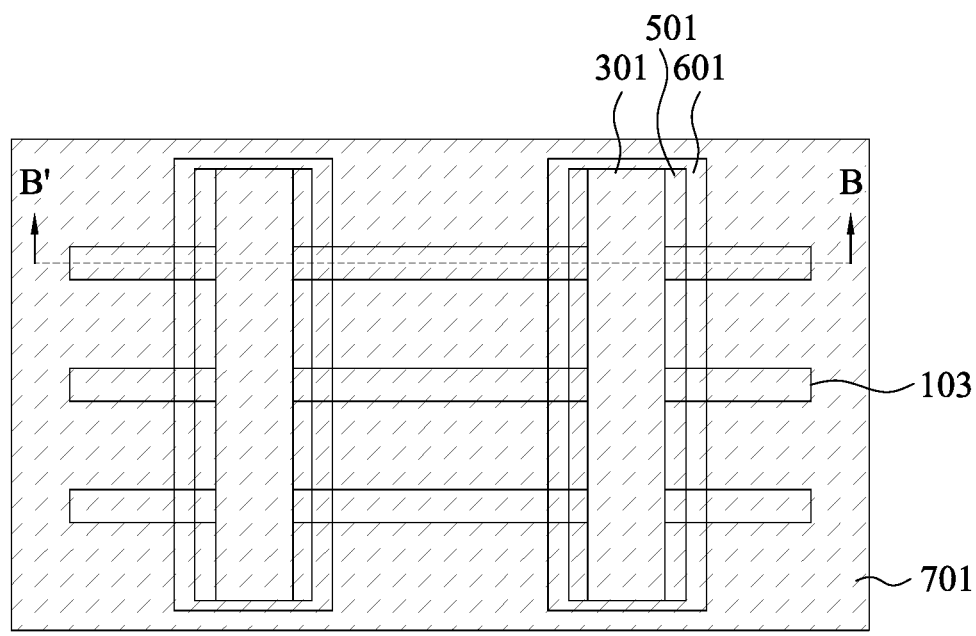
FIGS. 7A-7B illustrate formation of a functional word line material, in accordance with some embodiments.
Figure 7B:
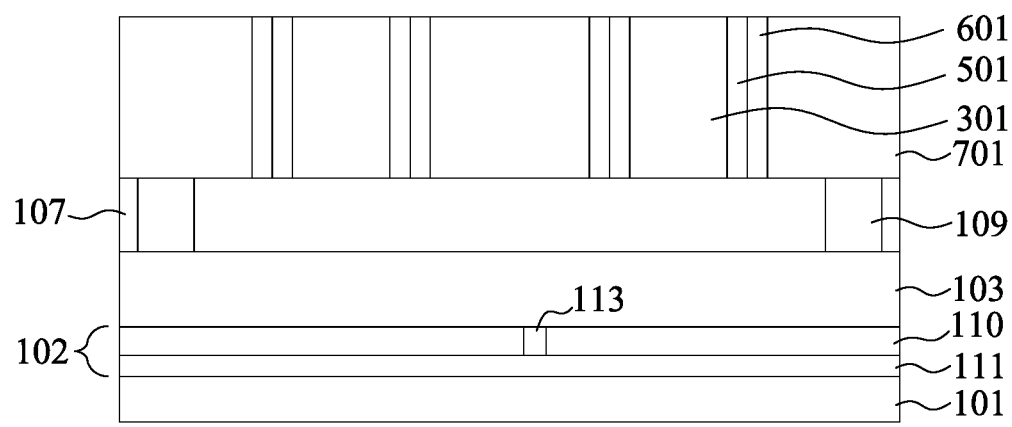

FIGS. 7A-7B illustrate deposition of a functional word line material 701 around the selectors 601. In these figures, FIG. 7A illustrates a top down view of FIG. 7B and FIG. 7B illustrates a cross-section view of FIG. 7A along line B-B'. In an embodiment the functional word line material 701 may be deposited using similar material and similar methods as the first word line 103 (described above with respect to FIGS. 1A-1B). For example, the material of the first word line 103 may be tungsten deposited using a chemical vapor deposition process. However, any method and/or material may be utilized.

Once the functional word line material 701 has been deposited, the functional word line material 701 may be planarized with the selectors 601. In an embodiment the functional word line material 701 may be planarized using a chemical mechanical polishing process. However, any other suitable processes, such as a grinding process or even a series of etching processes, may also be utilized.

Figure 8A:
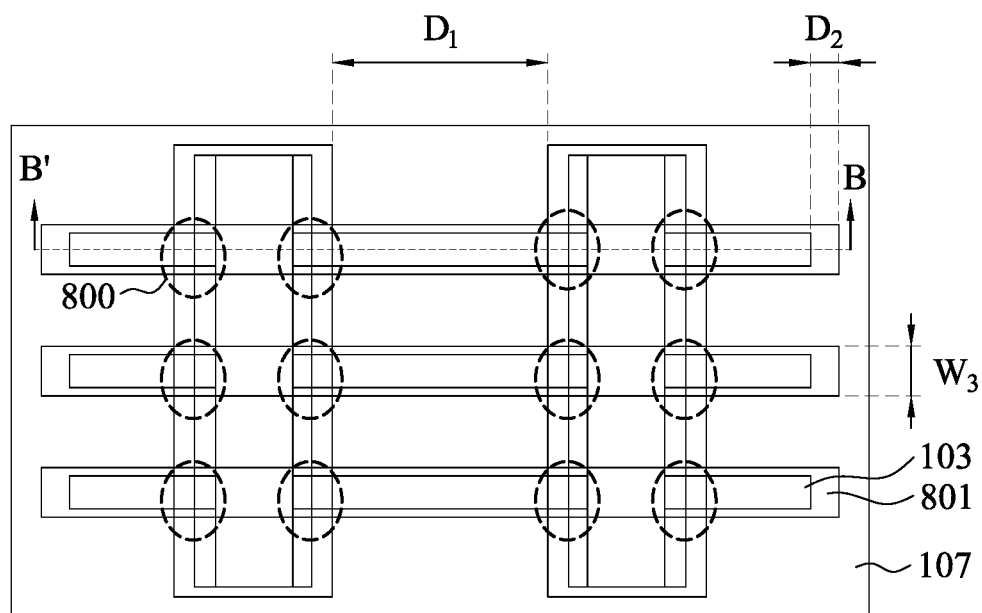
FIGS. 8A-8B illustrate formation of functional word lines, in accordance with some embodiments.
Figure 8B:
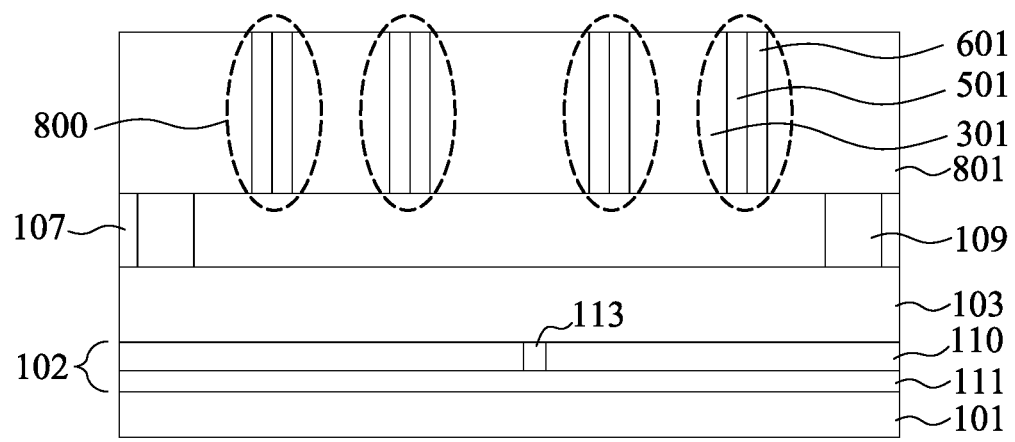

FIGS. 8A-8B illustrate that, once the functional word line material 701 has been deposited to fill the regions between the bit lines 301, the functional word line material 701 may be patterned into functional word lines 801 between the bit lines 301. In these figures, FIG. 8A illustrates a top down view of FIG. 8B and FIG. 8B illustrates a cross-section view of FIG. 8A along line B-B'. In an embodiment a photolithographic masking and etching process may be utilized in order to pattern the functional word line material 701. However, any suitable method may be utilized.

In an embodiment the functional word lines 801 may be formed to have a third width $W_3$ that is wider than the first width $W_1$ of the first word lines 103. In an embodiment the third width $W_3$ may be between about 40 nm and about 80 nm. Additionally, a first portion of the functional word lines 801 may extend between different sections of the selectors 601 a first distance $D_1$ of between about 40 nm and about 80 nm, while a second portion may extend beyond the first word lines 103 a second distance $D_2$ of between about 5 nm and about 10 nm. However, any suitable dimensions may be utilized.

Additionally, once the functional word lines 801 have been separated from each other, only some of the functional word lines 801 are electrically connected to the first word lines 103 below the functional word lines 801. For example, in the embodiment illustrated in FIGS. 8B, two of the three functional word lines 801 are in physical contact with the first vias 109 that electrically connect the functional word lines 801 to the first word lines 103. The remaining functional word line 801 (located between the two bit lines 301 illustrated in FIG. 8B) is at this point in the manufacturing process not electrically connected to the first word lines 103 (or any other word lines). As such, a separate connection may be made to the functional word line 801 located between the two bit lines 301, as described further below.

Finally, once the functional word lines 801 have been patterned and formed, combinations of the selectors 601 and the RRAM spacer 501 form multiple memory cells (represented in FIGS. 8A-8B by the dashed circles labeled 800) on opposite sides of the bit lines 301. Additionally, at this stage in the manufacturing process, only one of the memory cells 800 adjacent to any single one of the bit lines 301 is controlled by the first word line 103.

Figure 9A:
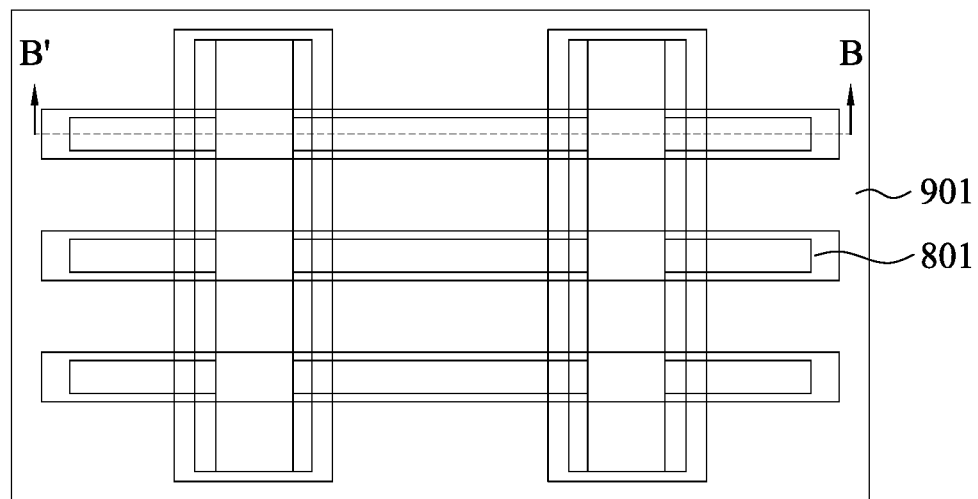
FIGS. 9A-9B illustrate formation of a dielectric layer, in accordance with some embodiments.
Figure 9B:
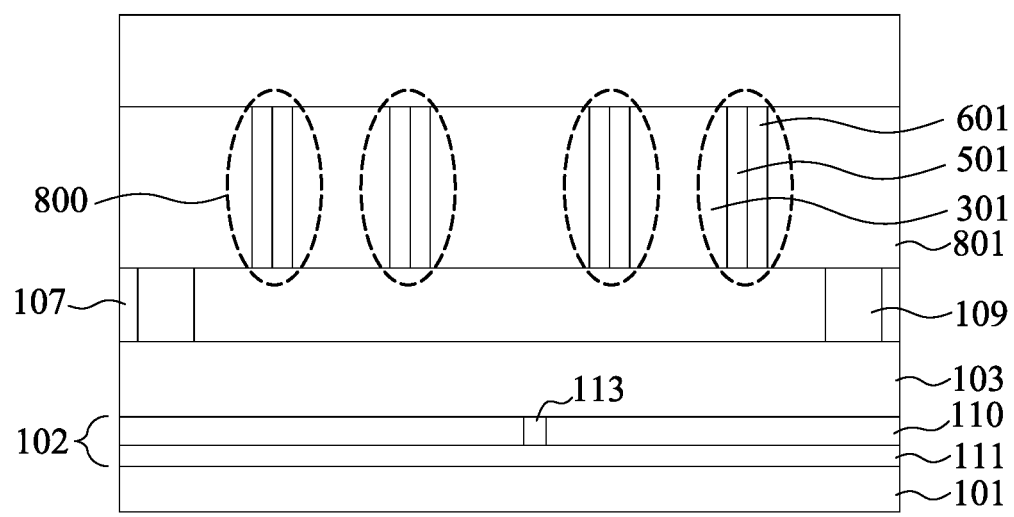

FIGS. 9A-9B illustrate that, once the functional word lines 801 have been patterned, a third dielectric layer 901 may be deposited in order to separate and isolate the functional word lines 801 from each other. In these figures, FIG. 9A illustrates a top down view of FIG. 9B and FIG. 9B illustrates a cross-section view of FIG. 9A along line B-B'. In an embodiment the third dielectric layer 901 may be deposited using similar materials and methods as the first dielectric layer 105 described above with respect to FIGS. 1A-1B. However, any materials and methods may be utilized to form the third dielectric layer 901.

Once the material of the third dielectric layer 901 has been deposited, the material of the third dielectric layer 901 may be planarized with the bit lines 301. In an embodiment the third dielectric layer 901 may be planarized using a chemical mechanical polishing process. However, any other suitable processes, such as a grinding process or even a series of etching processes, may also be utilized.

Figure 10A:
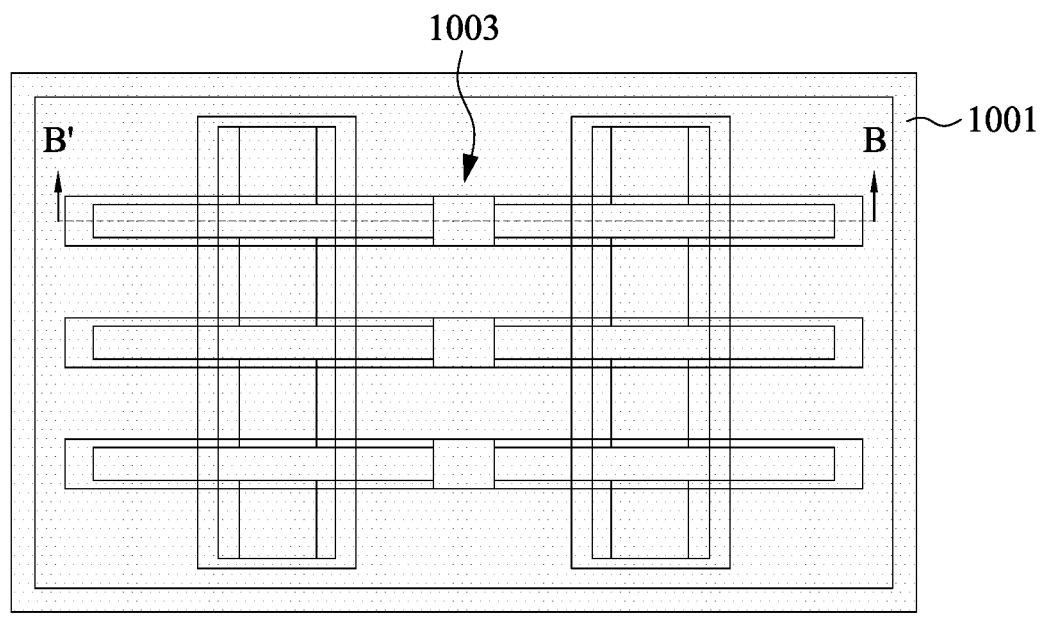
FIGS. 10A-10B illustrate formation of an opening through the dielectric layer, in accordance with some embodiments.
Figure 10B:
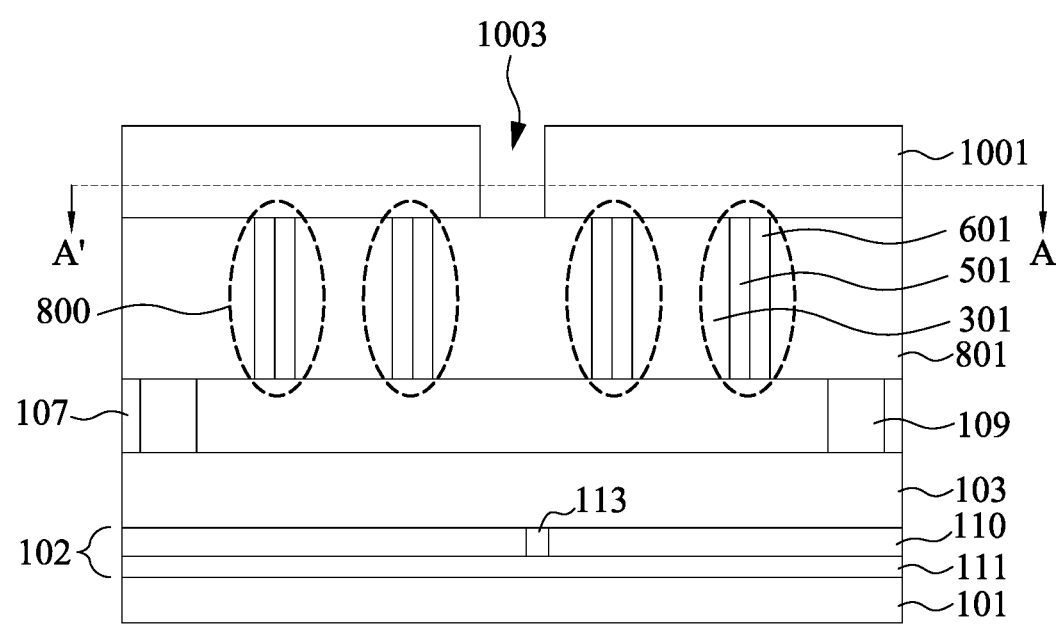

FIGS. 10A-10B illustrate that, once the third dielectric layer 901 has been planarized, a fourth dielectric layer 1001 may be deposited over the bit lines 301. In these figures, FIG. 10A illustrates a top down view of FIG. 10B along line A-A' and FIG. 10B illustrates a cross-section view of FIG. 10A along line B-B'. In an embodiment the fourth dielectric layer 1001 may be manufactured using similar materials and methods as the first dielectric layer 105 (described above with respect to FIGS. 1A-1B). However, any suitable methods and materials may be utilized.

FIGS. 10A-10B additionally illustrate a patterning of the fourth dielectric layer 1001 to form a second opening 1003 in order to begin forming second vias 1103 (not illustrated in FIGS. 10A-10B, but illustrated and described below with respect to FIGS. 11A-11B). In an embodiment the fourth dielectric layer 1001 may be patterned using, e.g., a photolithographic masking and etching process. However, any suitable methods may be utilized.

Figure 11A:
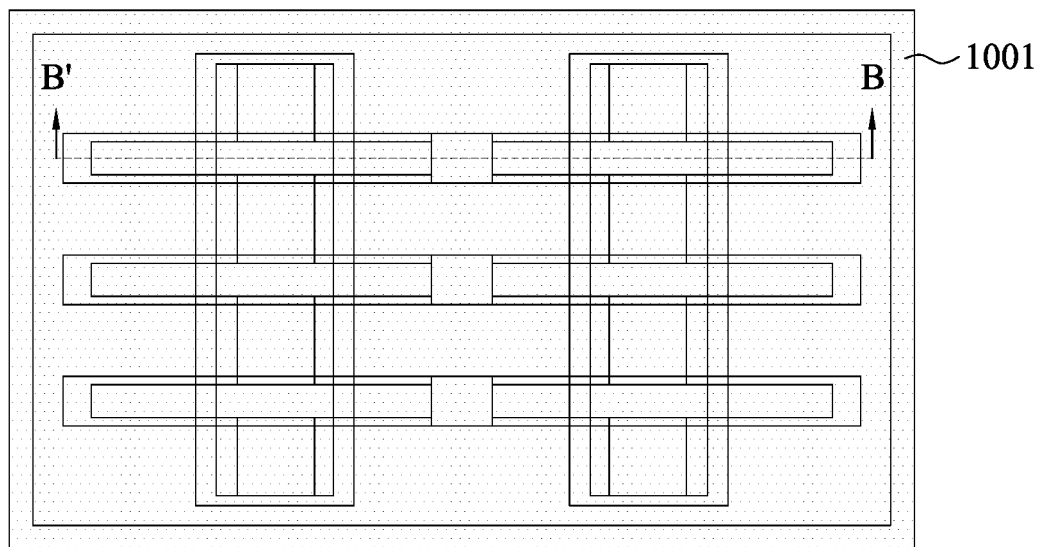
FIGS. 11A-11B illustrate formation of a second word line material, in accordance with some embodiments.
Figure 11B:
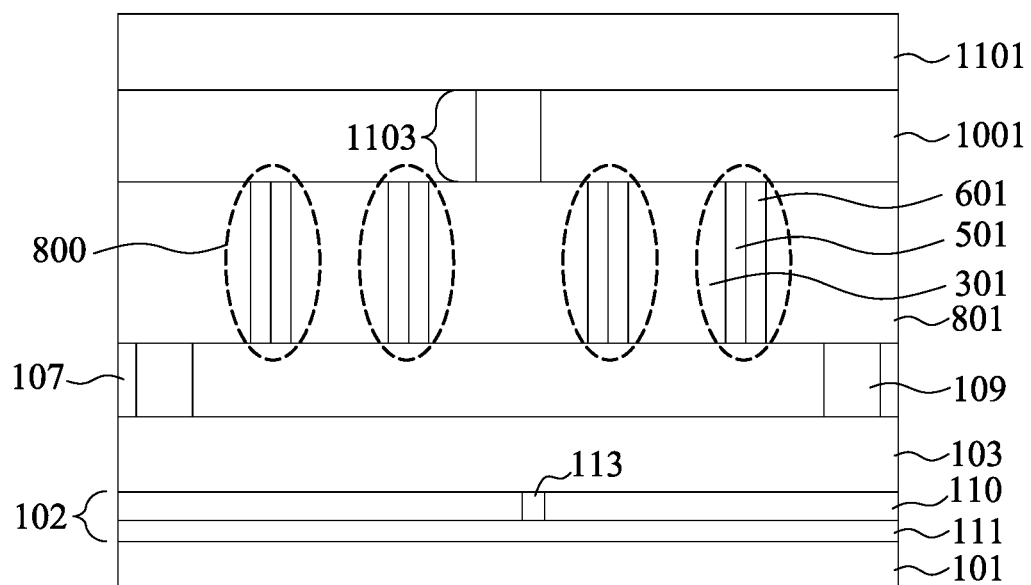

FIGS. 11A-11B illustrate a deposition of a word line material 1101 into the second opening 1003 and over the fourth dielectric layer 1001 in order to form the second vias 1103 (illustrated as being separated from the remainder of the word line material 1101, but in which there may or may not be a physical separation) and to begin forming second word lines 1201 (not illustrated in FIGS. 11A-11B but illustrated and described further below with respect to FIGS. 12A-12B). In these figures, FIG. 11A illustrates a top down view of FIG. 11B and FIG. 11B illustrates a cross-section view of FIG. 11A along line B-B'. In an embodiment the word line material 1101 may be deposited using similar methods and materials as the first word line 103, described above with respect to FIGS. 1A-1B. For example, the word line material 1101 may be deposited as tungsten using a chemical vapor deposition process. However, any suitable methods and materials may be utilized.

Once the word line material 1101 has been deposited, the word line material 1101 may be planarized in order to prepare the word line material 1101 for further processing. In an embodiment the word line material 1101 may be planarized using a chemical mechanical polishing process. However, any other suitable processes, such as a grinding process or even a series of etching processes, may also be utilized.

Additionally, while not explicitly illustrated in FIGS. 11A-11B, multiple ones of the second vias 1103 are manufactured at the same time such that each of the functional word lines 801 is electrically connected to a separate word line than adjacent functional word lines. In such an embodiment the second vias 1103 may also be separated from each other by the first pitch $P_1$. However, any suitable pitch may be utilized.

Figure 12A:
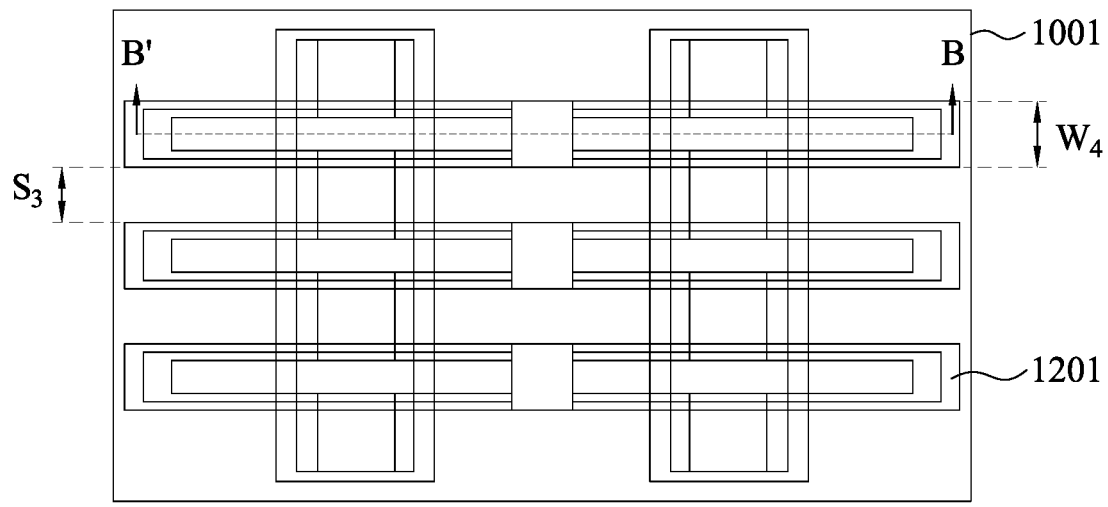
FIGS. 12A-12B illustrate formation of a second word line, in accordance with some embodiments.
Figure 12B:
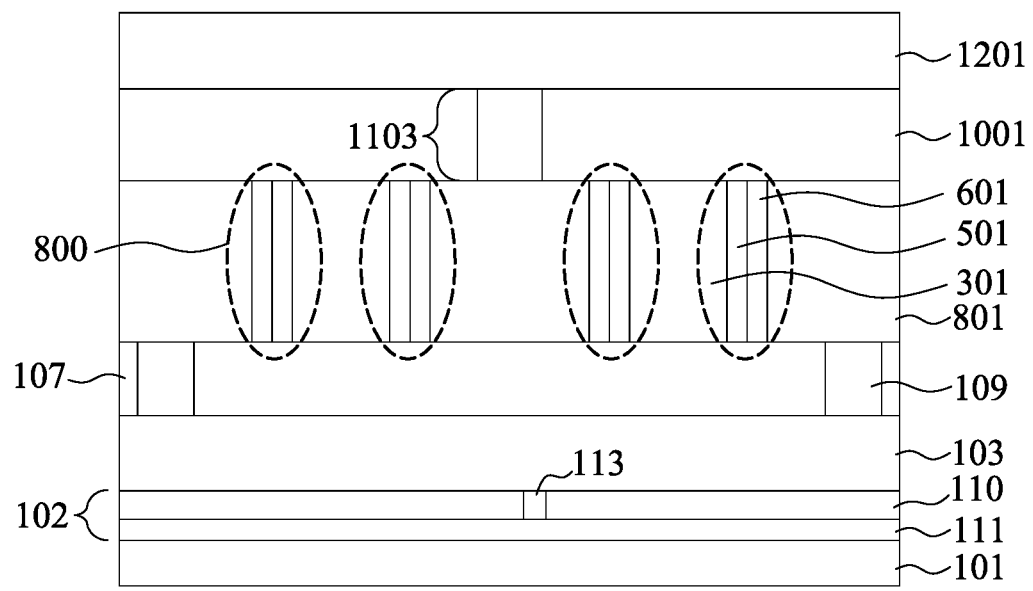

FIGS. 12A-12B illustrate that, once the word line material 1101 has been planarized, the word line material 1101 may be patterned in order to form multiple ones of the second word lines 1201. In these figures, FIG. 12A illustrates a top down view of FIG. 12B and FIG. 12B illustrates a cross-section view of FIG. 12A along line B-B'. In an embodiment a photolithographic masking and etching process may be utilized in order to pattern the word line material 1101. However, any suitable method may be utilized.

In an embodiment the second word lines 1201 may be formed to have a fourth width $W_4$ that is wider than the third width $W_3$ of the functional word lines 801. In an embodiment the fourth width $W_4$ may be between about 40 nm and about 80 nm. Additionally, the second word lines 1201 may be spaced apart from each other a third spacing $S_3$ of between about 40 nm and about 80 nm. However, any suitable dimensions may be utilized.

Once formed, the second word lines 1201 are electrically connected to different portions of the functional word lines 801 that are not otherwise connected (e.g., not connected to the first word lines 103) and, hence, control memory cells 800 on opposite sides of the bit lines 301 than those controlled by the first word lines 103. In particular, the second word lines 1201 are physically connected to the second vias 1103, which electrically connect the second word lines 1201 to those portions of the functional word lines 801 that are located between the bit lines 301. As such, each of the functional word lines 801 is connected to one of either the first word lines 103 or the second word lines 1201, wherein the different word lines are located on different sides of the functional word lines 801.

Figure 13A:
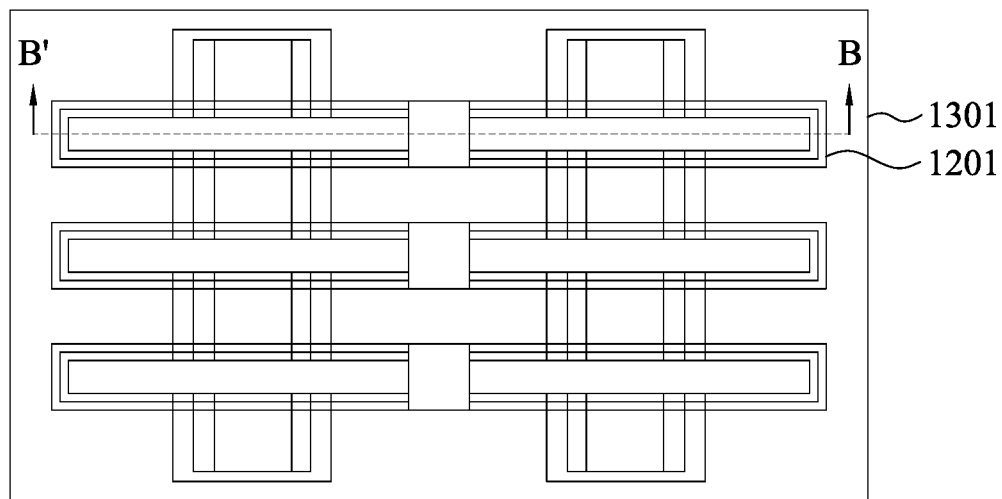
FIGS. 13A-13C illustrate formation of a dielectric layer, in accordance with some embodiments.
Figure 13B:
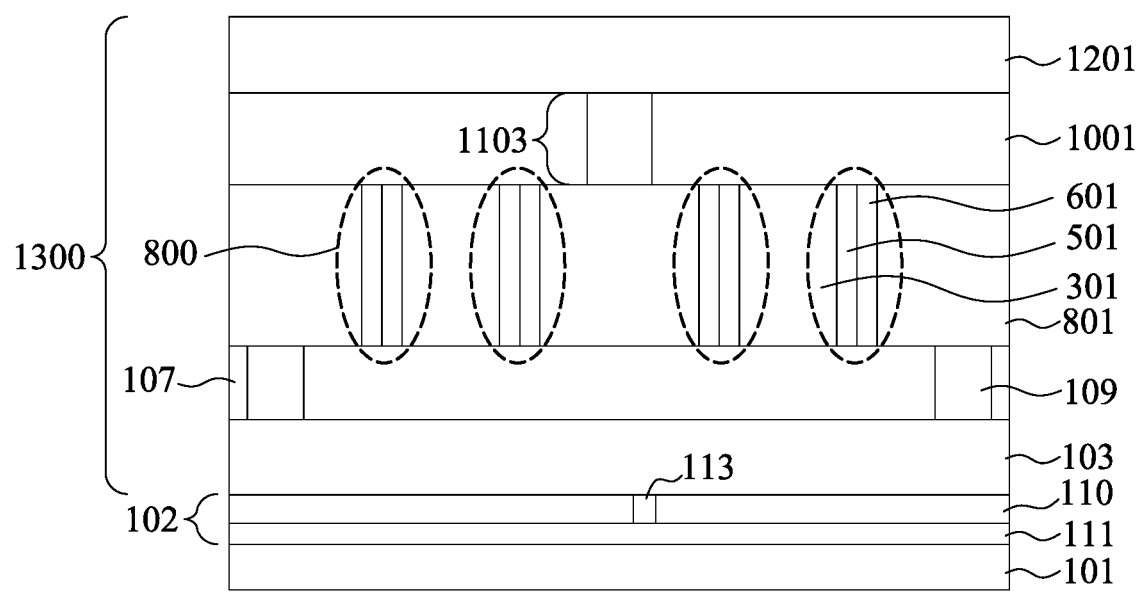

FIGS. 13A-13B illustrate a deposition of a fifth dielectric layer 1301 in order to separate and isolate the second word lines 1201 from each other and to complete one embodiment of a double sided word line structure 1300. In these figures, FIG. 13A illustrates a top down view of FIG. 13B and FIG. 13B illustrates a cross-section view of FIG. 3A along line B-B'. In an embodiment the fifth dielectric layer 1301 may be deposited using similar materials and methods as the first dielectric layer 105, described above with respect to FIGS. 1A-1B. However, any suitable method of deposition and materials may be utilized.

Once the material of the fifth dielectric layer 1301 has been deposited, the fifth dielectric layer 1301 may be planarized in order to prepare the fifth dielectric layer 1301 for further processing. In an embodiment the fifth dielectric layer 1301 may be planarized using a chemical mechanical polishing process. However, any other suitable processes, such as a grinding process or even a series of etching processes, may also be utilized.

Figure 13C:
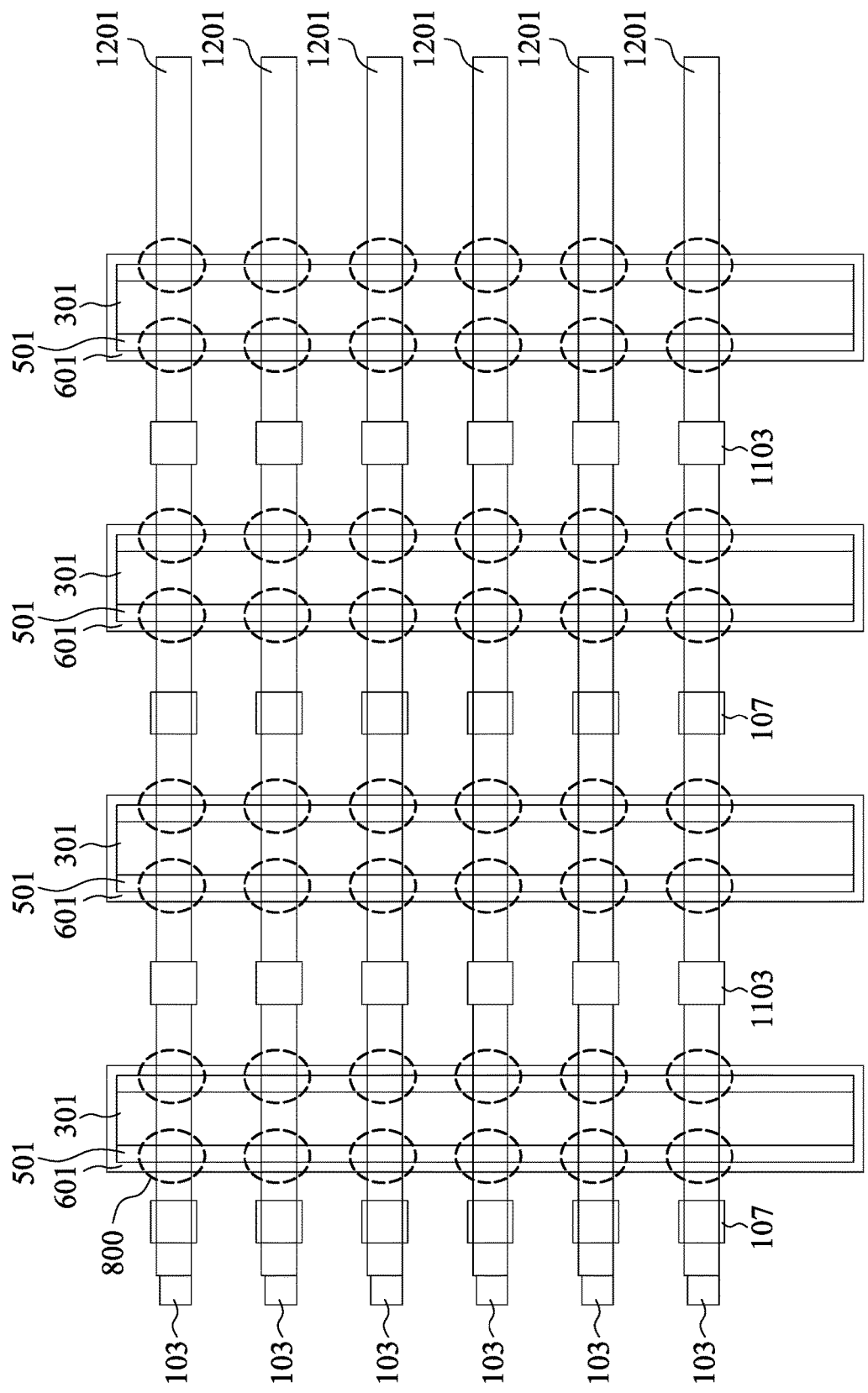

FIG. 13C illustrates an expanded top down view which helps to illustrate the overall cell scheme of the memory cells 800 along with their associated word lines, wherein other structures have been removed from this figure for clarity. As illustrated the bit lines 301 have memory cells 800 located on both sides, wherein memory cells 800 on one side are in electrical connection with the first word lines 103 through the first vias 109 and wherein memory cells 800 on another side of the bit lines 301 are in electrical connection with the second word lines 1202 through the second vias 1103.

Figure 14:
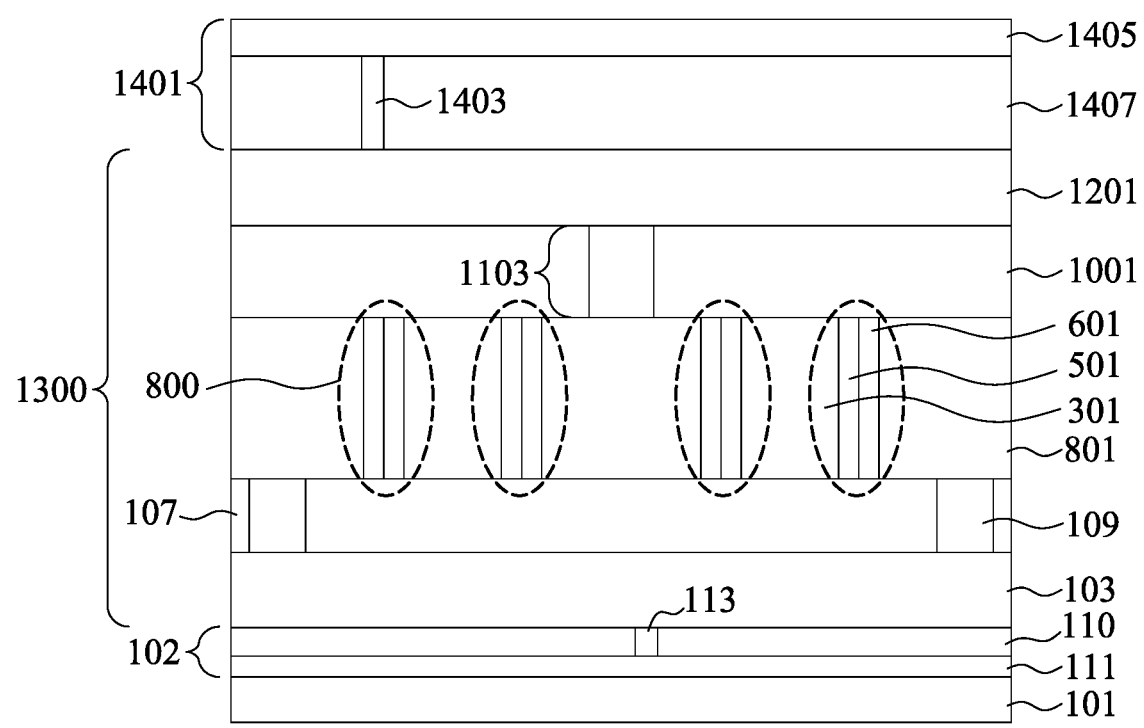
FIG. 14 illustrates formation of metallization layers, in accordance with some embodiments.

FIG. 14 illustrates that, once the fifth dielectric layer 1301 has been deposited and planarized, second metallization layers 1401 may be formed over the second word lines 1201 in order to electrically connect the second word lines 1201 to other functional circuitry. In an embodiment the second metallization layers 1401 may be formed in a similar manner and with similar materials as the first metallization layers 102 (described above with respect to FIGS. 1A-1B). In a particular embodiment, the second metallization layers 1401 may comprise a dielectric layer 1407 with a second metallization via 1403, and a fifth metal line 1405 connected to the second metallization via 1403. However, any suitable or desired number of dielectric layers, metallization vias, and metal lines may be utilized.

By manufacturing the embodiments as described above, separate word lines (e.g., the first word lines 103 and the second word lines 1201) are formed as two separate layers both above and below the functional word lines 801. As such, one word line (e.g., the first word line 103) can control memory cells 800 located on one side of the bit lines 301 through a bottom via connection, and a second word line (e.g., the second word line 1201) can control the memory cells 800 located on a second side of the bit lines 301 through a top via connection. As such, by putting separate word lines in different layers, the number of cells can be doubled in the same size area without an area penalty and also without the use of dummy cells.

Figure 15:
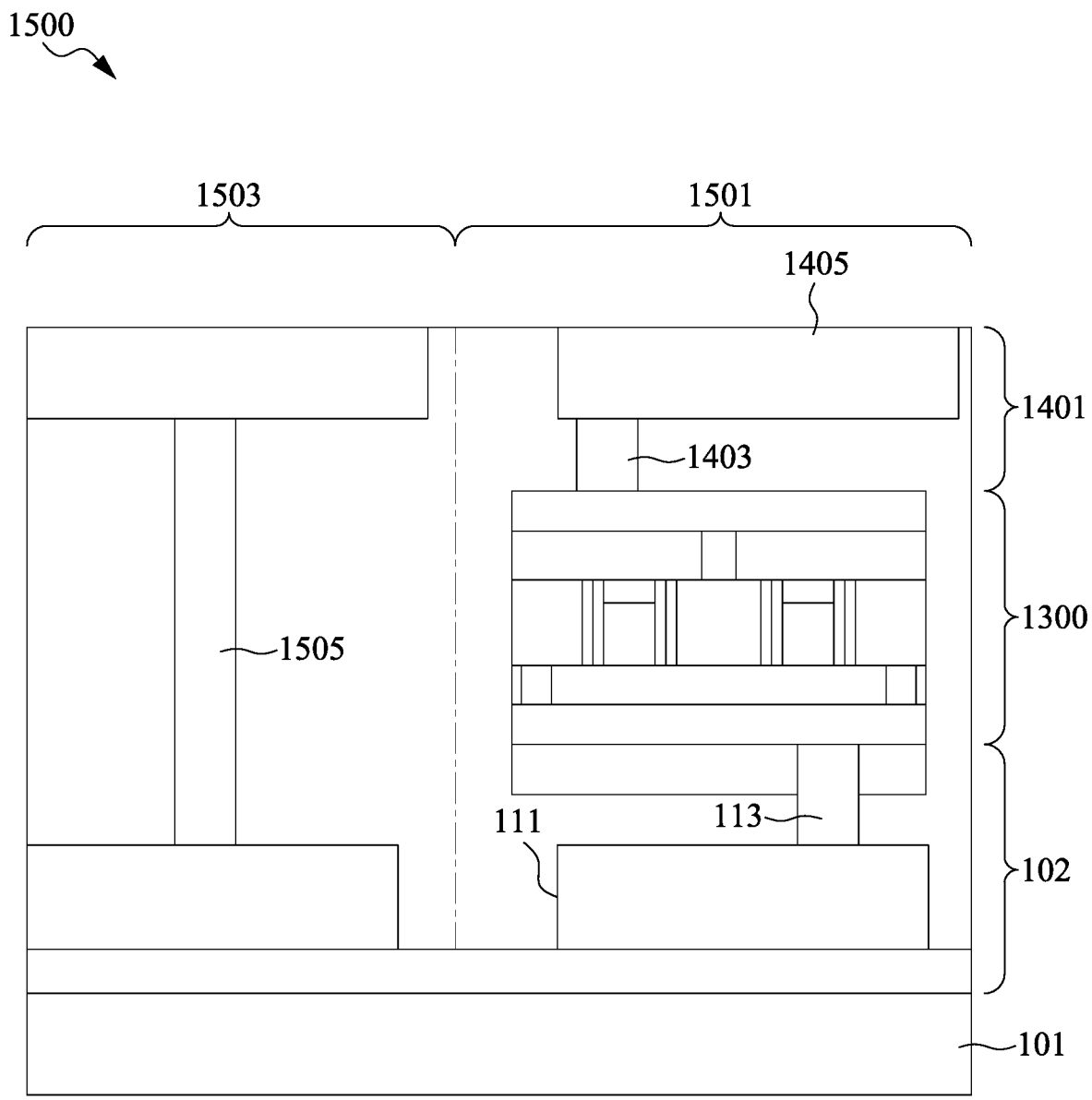
FIG. 15 illustrates a memory region adjacent to a logic region, in accordance with some embodiments.

FIG. 15 illustrates another embodiment in which the double sided word line structure 1300 is incorporated within the metallization layers of a larger semiconductor device 1500. In this embodiment, the semiconductor device 1500 has a memory region 1501 and a logic region 1503 over the substrate 101. Within the memory region 1501, the double sided word line structure 1300 is manufactured between the first metallization layers 102 and the second metallization layers 1401 (e.g., between the fourth metal line 111 and the fifth metal line 1405). In an embodiment the double sided word line structure 1300 may be manufactured as described above with respect to FIGS. 1A-14.

In the logic region 1503, however, the semiconductor device 1500 comprises active devices and other logic devices. As such, there is no memory structure such as the double sided word line structure 1300 within the logic region 1503. As such, those regions within the logic region 1503 and which are at the same level as the double sided word line structure 1300 are filled with one or more dielectric materials, including the dielectric layer 110, the second dielectric layer 107, the fourth dielectric layer 1001, the dielectric layer 1407, and other dielectric materials. For clarity, these various dielectric layers are not separately illustrated as individual layers within the logic region 1503, but are, instead, represented as a single, generic layer.

FIG. 15 additionally illustrates the formation of a third metallization via 1505 through the one or more dielectric materials in order to connect the fourth metal line 111 and the fifth metal line 1405 within the logic region 1503. In an embodiment the third metallization via 1505 may be manufactured using similar materials and similar methods as described above for the second metallization via 1403. In more specific embodiments, the third metallization via 1505 may be manufactured simultaneously as the second metallization via 1403, although in other embodiments the third metallization via 1505 may be manufactured either before or after the second metallization via 1403. In such embodiments the third metallization via 1505 may be formed using suitable lithographic masking and etching techniques using one or more anisotropic etching processes to form an opening through the dielectric materials to the fourth metal line 111. Once an opening has been formed the opening may be filled and/or overfilled with one or more conductive materials, which are then planarized. However, any suitable methods may be utilized.

By incorporating the double sided word line structure 1300 into the metallization layers, a more robust device may be obtained. In particular, by incorporating the double sided word line structure 1300 into the memory region 1501 of the semiconductor device 1500, and by utilizing the multiple words lines which vertically overlap each other, there is an increased routing flexibility that allows the different word lines to be connected to different logic metal layers.

Figure 16A:
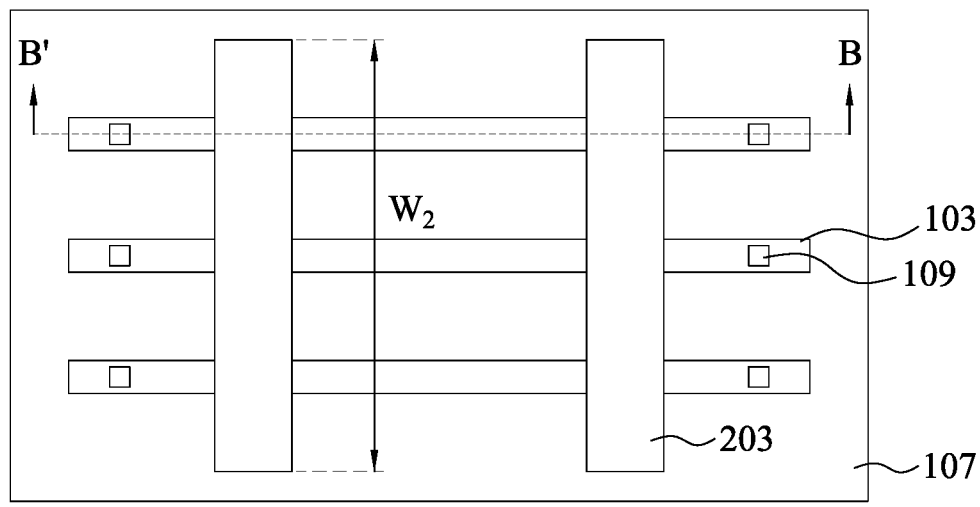
FIGS. 16A-16B illustrate placement of a first hard mask, in accordance with some embodiments.
Figure 16B:
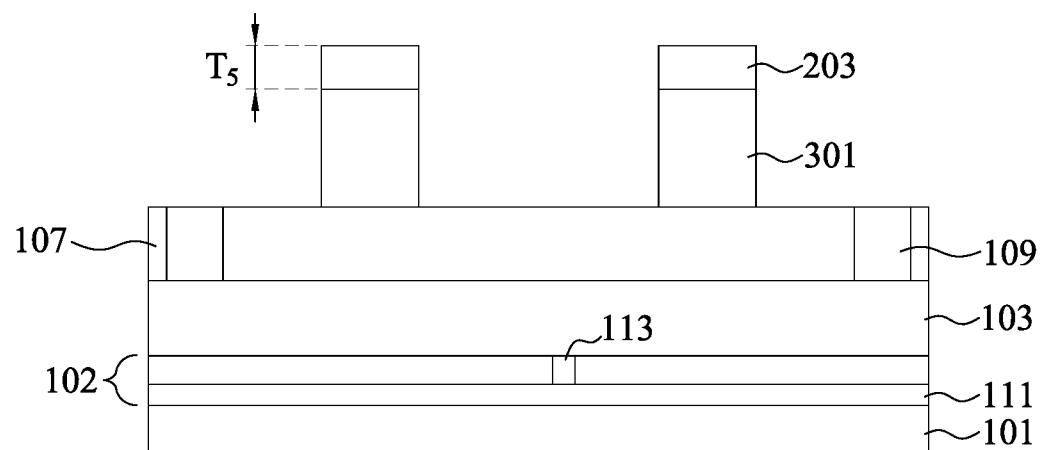

FIGS. 16A-16B illustrate another embodiment in which the double sided word line structure 1300 may be manufactured. In these figures, FIG. 16A illustrates a top down view of FIG. 16B and FIG. 16B illustrates a cross-section view of FIG. 16A along line B-B'. In this embodiment, the first hard mask 203 that is used to pattern the bit lines 301, instead of being removed after the bit lines 301 have been patterned (as described above with respect to FIGS. 3A-3B), are instead left in place during subsequent processing. As such, as can be seen in FIG. 16A-16B, the first hard mask 203 remains covering the top surface of the bit lines 301.

In this embodiment the first hard mask 203, after the forming of the bit lines 301 may be formed to have a fifth thickness $T_5$ of between about 5 nm and about 30 nm. Further, the bit lines 103 may be formed to have the second width $W_2$. However, any suitable dimensions may be utilized.

Figure 17A:
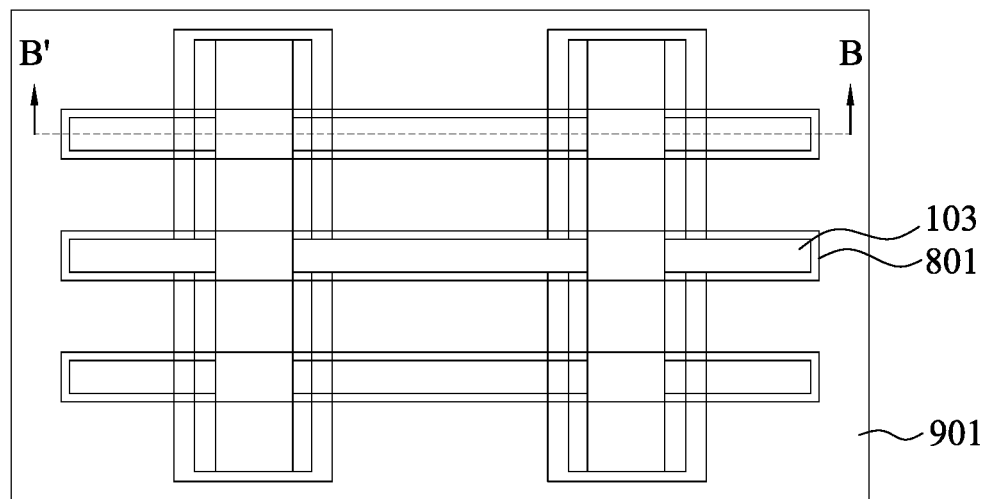
FIGS. 17A-17B illustrate formation of functional word lines with the first hard mask in place, in accordance with some embodiments.
Figure 17B:
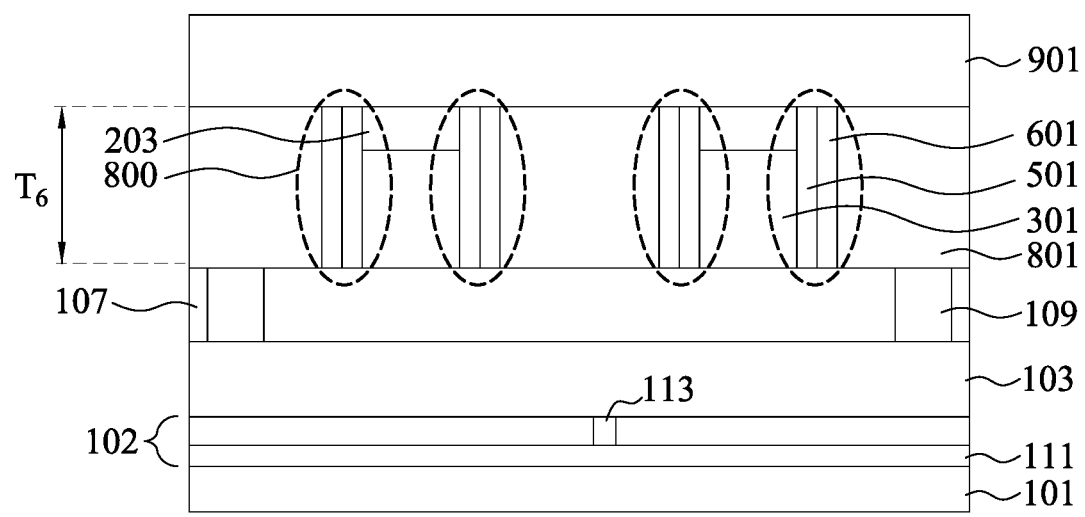

FIGS. 17A-17B illustrate that, with the first hard mask 203 still in place over the bit lines 301, the manufacturing process may continue as described above, with FIG. 17A illustrating a top down view of FIG. 17B and FIG. 17B illustrating a cross-section view of FIG. 17A along line B-B'. In a particular embodiment the RRAM spacers 501 are deposited and patterned as described above with respect to FIGS. 5A-5B, the selectors 601 are deposited and patterned as described above with respect to FIGS. 6A-6B, and the functional word lines 801 are deposited and patterned as described above with respect to FIGS. 8A-8B. In these embodiments, however, each of the RRAM spacers 501, the selectors 601, and the functional word lines 801 may have a sixth thickness $T_6$ that is equal to a combined thickness of the bit lines 301 and the first hard mask 203, such as being between about 110 nm and about 200 nm. However, any suitable dimensions may be used.

Figure 18A:
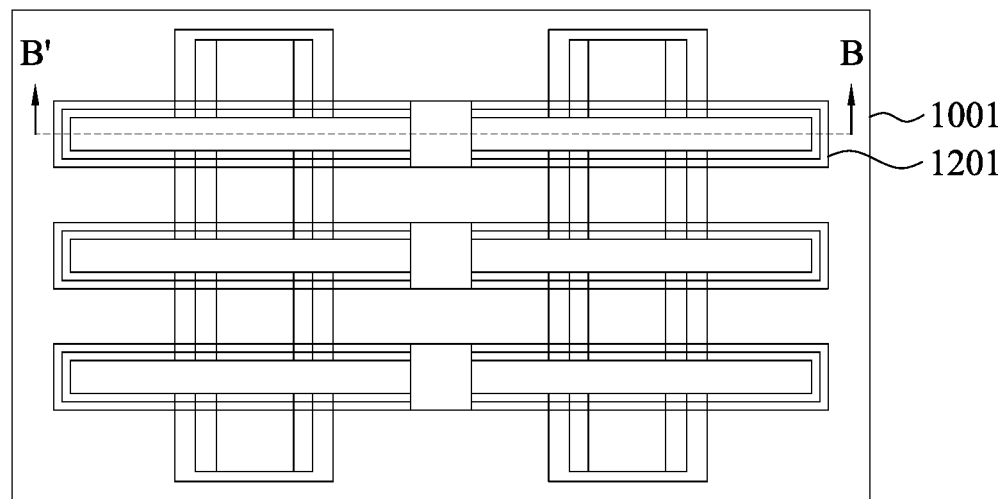
FIGS. 18A-18B illustrate formation of the second word line with the first hard mask in place, in accordance with some embodiments.
Figure 18B:
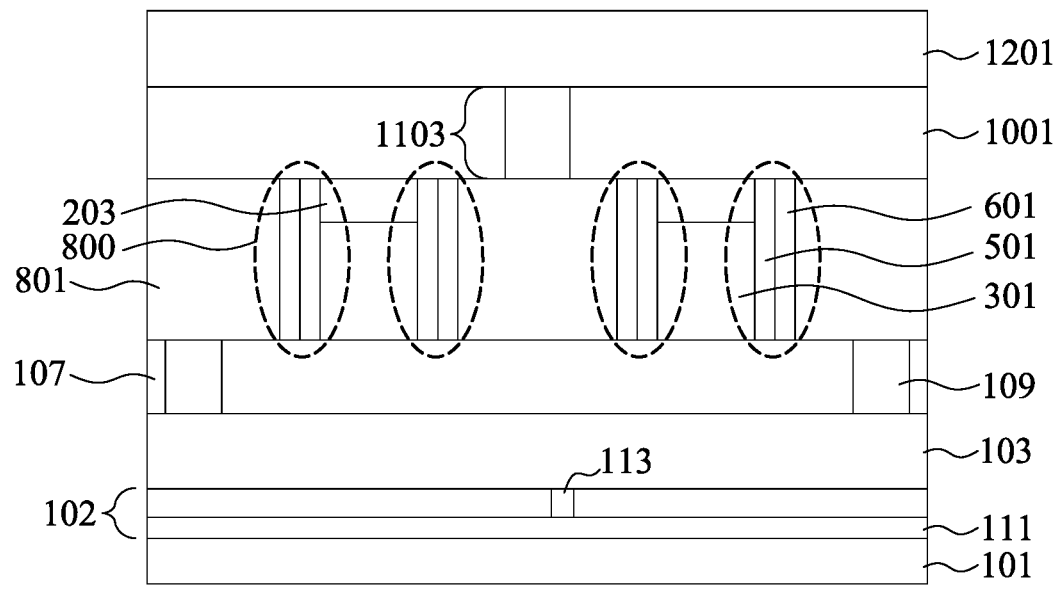

FIGS. 18A-18B further illustrate the continuation of the manufacturing process with the first hard mask 203 remaining in place over the bit lines 301, in which FIG. 18A illustrates a top down view of FIG. 18B and FIG. 18B illustrates a cross-section view of FIG. 18A along line B-B'. In a particular embodiment the fourth dielectric layer 1001 is deposited and patterned as described above with respect to FIGS. 10A-10B, the second vias 1103 are manufactured as described above with respect to FIGS. 11A-11B, and the second word lines 1201 are formed as described above with respect to FIGS. 12A-12B. If desired, after the second word lines 1201 have been formed, the second metallization layers 1401 (not illustrated in FIGS. 18A-18B) may be formed as described above with respect to FIG. 14. Of course, any other suitable methods or steps may be utilized as well.

As can be seen in these figures, with the first hard mask 203 in place during subsequent manufacturing processes, the fourth dielectric layer 1001 is deposited directly on and in physical contact with the first hard mask 203. As such, the first hard mask 203 can help to enlarge the yield window and help prevent leakage during subsequent manufacturing processes such as the manufacture of the second vias 1103. The first hard mask 203 is also in place to further electrically isolate the bit lines 301 even after the first hard mask 203 has been used to manufacture the bit lines 301. Each of these help to improve the overall yield of the manufacturing process by reducing defects and helps to improve the operation of the structures being manufactured.

Figure 19:
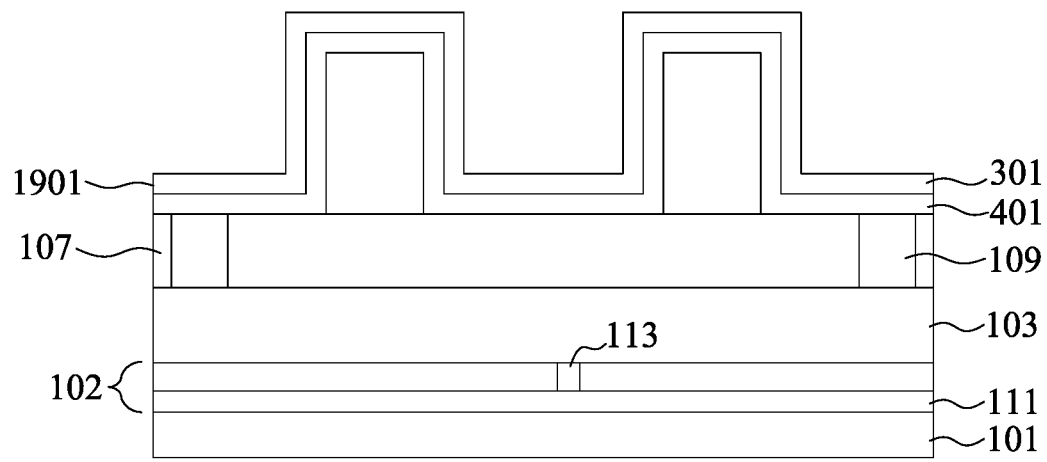
FIG. 19 illustrates formation of selector material prior to patterning the RRAM material, in accordance with some embodiments.
Figure 20:
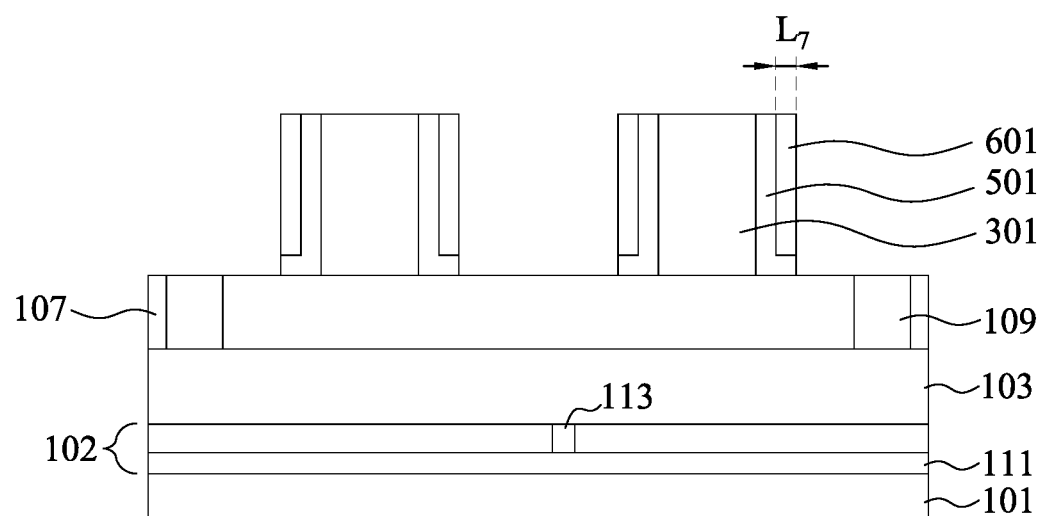
FIG. 20 illustrates patterning of the RRAM material with the selector material to form an "L" shape, in accordance with some embodiments.
Figure 21:
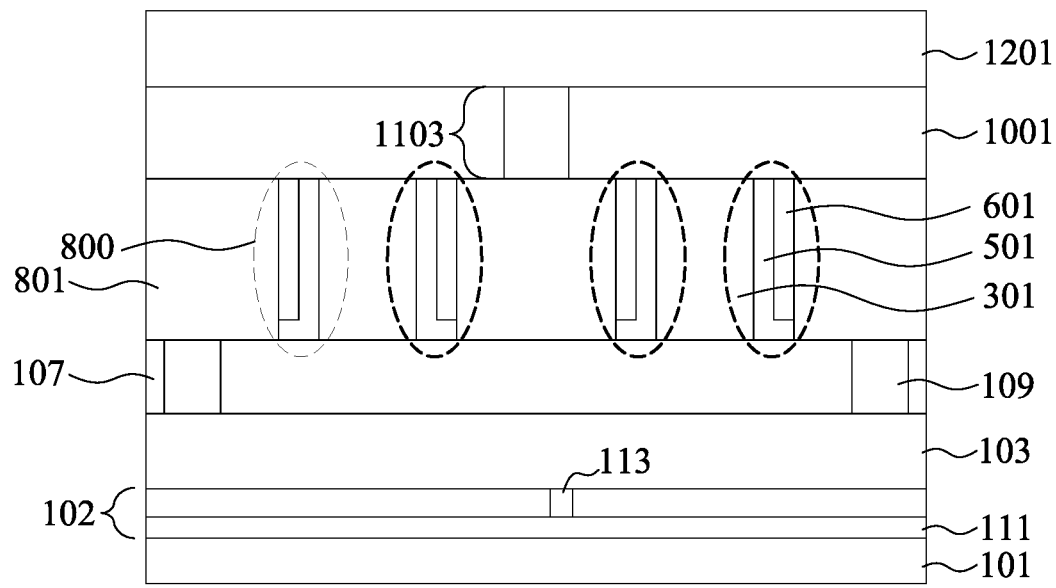
FIG. 21 illustrates formation of the second word line with the patterned RRAM material in the "L" shape, in accordance with some embodiments.

FIGS. 19-21 illustrate another embodiment which utilizes an "L"-like RRAM structure (instead of the "bar"-like structure described above with respect to FIGS. 1A-18B). In this embodiment the initial steps of the manufacturing process are similar to the processes described above with respect to FIGS. 1A-4B. In particular, the first word line 103 is manufactured, the bit lines 301 are manufactured over the first word line 103, and the RRAM material 401 is deposited over the bit lines 301.

In this embodiment, however, the RRAM material 401 is not patterned into the bar shape as described above with respect to FIGS. 5A-5B. Rather, as illustrated in FIG. 19, and without patterning the RRAM material 401, the selector material 1901 is deposited over the RRAM material 401. In an embodiment the selector material 1901 is deposited as described above with respect to FIGS. 6A-6B, such as by being conformally deposited over the RRAM material 401. However, any suitable methods and materials may be utilized.

FIG. 20 illustrates that, once the selector material 1901 has been deposited over the unpatterned RRAM material 401, both the selector material 1901 and the RRAM material 401 may be patterned together. In an embodiment the selector material 1901 and the RRAM material 401 may be patterned using one or more anisotropic etches (e.g., reactive ion etches) in order to remove horizontal portions of both the selector material 1901 and the RRAM material 401 in order to form the RRAM spacers 501 and the selectors 601.

However, by waiting to pattern the RRAM material 401 until after the selector material 1901 has been deposited, a portion of the selector material 1901 is in place to protect a horizontal portion of the RRAM material 401 adjacent to the bit lines 301. As such, while the selector material 1901 has a "bar" shape separated from the second dielectric layer 107 by the RRAM spacers 501, the RRAM spacers 501 will take on an "L" shape, with a portion of the RRAM spacers 501 extending along the second dielectric layer 107.

Once formed, the selectors 601 may have a seventh length $L_7$ of between about 5 nm and about 30 nm. Additionally, because the selectors 601 protect the underlying portion of the RRAM material 401, the RRAM spacers 501 will extend along the second dielectric layer 107 a distance equal to the seventh length $L_7$. However, any suitable dimensions may be utilized.

FIG. 21 illustrates that, once the RRAM spacers 501 (with the "L" shaped structure) and the selectors 601 have been formed, further processing may be performed as described above with respect to FIGS. 7A-14. For example, in some embodiments the functional word lines 801 are manufactured, the fourth dielectric layer 1001 is deposited, and the second word lines 1201 are formed. However, any suitable methods and structures may be utilized.

Figure 22:
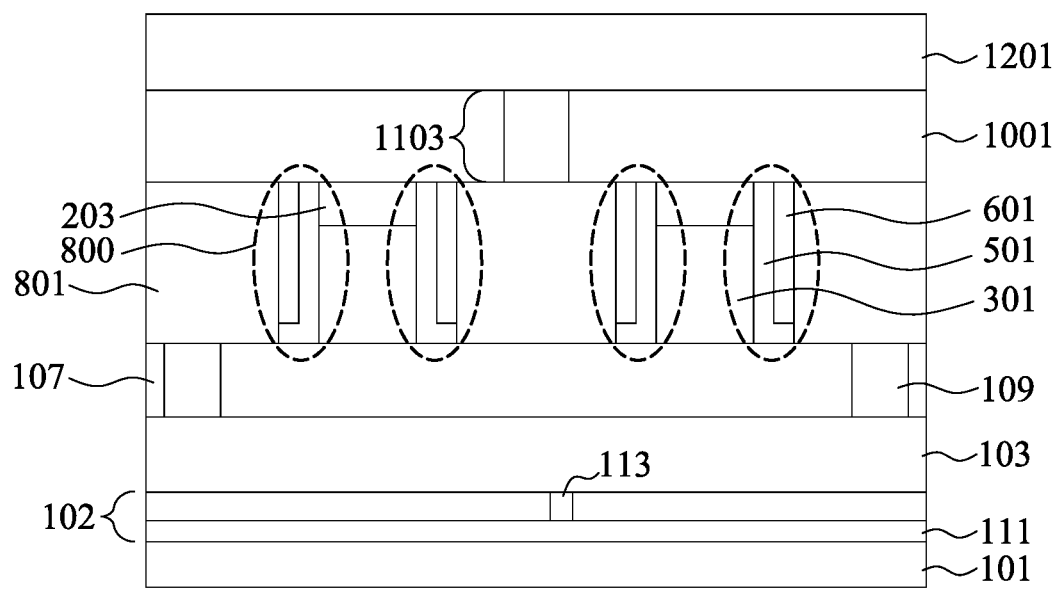
FIG. 22 illustrates forming the RRAM material in the "L" shape while the first hard mask is in place, in accordance with some embodiments.

FIG. 22 illustrates yet another embodiment which utilizes the RRAM spacers 501 with the "L" shaped structure. In this embodiment, however, the first hard mask 203 is left in place over the bit lines 301. In particular, the bit lines 301 and the first hard mask 203 are manufactured as described above with respect to FIGS. 16A-16B, whereby the first hard mask 203 is left in place over the bit lines 301.

Once the bit lines 301 have been formed, the RRAM material 401 is deposited over both the bit lines 301 and the first hard mask 203. Similarly, the selector material 1901 is deposited over the RRAM material 401 without an intermediate patterning of the RRAM material 401. After the RRAM material 401 and the selector material 1901 have been deposited, the RRAM material 401 and the selector material 1901 are patterned together as described above with respect to FIG. 20. As such, the RRAM spacer 501 has the "L" shape and the structure also retains the presence of the first hard mask 203.

By manufacturing the embodiments as described above (e.g., by utilizing separate word lines on opposite sides of the memory cells), the physical limitations of the word lines can be removed and the number of cells within a given area can be doubled. In particular, by manufacturing the first word lines 103 and the second word lines 1201 as two separate layers both above and below the functional word lines 801, limitations usually placed upon adjacent word lines can be removed. As such, one word line (e.g., the first word line 103) can control one side of the cells through a bottom via connection, and a second word line (e.g., the second word line 1201) can control the second side of the cells through a top via connection.

In accordance with an embodiment, a method of manufacturing a semiconductor device includes: forming a first word line over a substrate; forming a bit line over the first word line; after the forming the first word line, forming a first memory cell and a second memory cell on opposite sides of the bit line; depositing a second word line adjacent to the first memory cell and in electrical connection with the first word line; depositing a third functional word line adjacent to the second memory cell; and after the depositing the third functional word line, forming a fourth word line in electrical connection with the third functional word line. In an embodiment, the forming the first memory cell further includes: depositing RRAM material; patterning the RRAM material; after the patterning the RRAM material, depositing a selector material; and patterning the selector material. In an embodiment, the forming the first memory cell further includes: depositing RRAM material; prior to a patterning of the RRAM material, depositing a selector material; patterning the selector material; and patterning the RRAM material. In an embodiment, the forming the bit line includes: depositing a bit line material; depositing and patterning a hard mask; patterning the bit line material to form the bit line; and removing the hard mask. In an embodiment, the forming the bit line includes: depositing a bit line material; depositing and patterning a hard mask; and patterning the bit line material to form the bit line, wherein the forming the first memory cell is performed with the hard mask in place. In an embodiment, the first memory cell is formed within a memory region adjacent to a logic region. In an embodiment, the forming the first word line over the substrate forms the first word line over first metallization layers.

In another embodiment, a method of manufacturing a semiconductor device, the method includes: forming a bottom word line over a substrate; forming a first bit line over the bottom word line; forming RRAM material adjacent to the first bit line; forming a selector material adjacent to the RRAM material; forming a first word line on a first side of the first bit line, the first word line in electrical connection with the bottom word line; forming a second word line on a second side of the first bit line opposite the first side; and forming a top word line over and in electrical connection with the second word line. In an embodiment, the method further includes patterning the RRAM material into a bar shape. In an embodiment, the method further includes patterning the RRAM material into an "L" shape. In an embodiment, the method further includes patterning the selector material into a bar shape. In an embodiment, the forming the first bit line includes: depositing a first material; depositing and patterning a hard mask; patterning the first material using the hard mask as a mask; and removing the hard mask. In an embodiment, the forming the first bit line includes: depositing a first material; depositing and patterning a hard mask; and patterning the first material using the hard mask as a mask, wherein the forming the RRAM material forms the RRAM material adjacent to the hard mask. In an embodiment, the method further includes patterning the RRAM material into an "L" shape.

In yet another embodiment, a semiconductor device includes: a bit line disposed on a dielectric layer; a first memory cell disposed on a first sidewall of the bit line; a second memory cell disposed on a second sidewall of the bit line opposite the first sidewall; a first word line disposed on the dielectric layer, wherein the first memory cell is disposed between the first sidewall of the bit line and a sidewall of the first word line; a second word line disposed on the dielectric layer, wherein the second memory cell is disposed between the second sidewall of the bit line and a sidewall of the second word line; a top word line disposed over the bit line and electrically connected to the first word line; and a bottom word line disposed under the bit line and electrically connected to the second word line. In an embodiment the first memory cell comprises a bar shaped RRAM material. In an embodiment the first memory cell comprises an "L" shaped RRAM material. In an embodiment the semiconductor device further includes a first hard mask in physical contact with the bit line, wherein the first hard mask and the bit line have aligned sidewalls. In an embodiment the first memory cell comprises an "L" shaped RRAM material. In an embodiment the first memory cell is located within a memory region adjacent to a logic region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
 a first word line over a substrate;
 a bit line over the first word line;
 a first memory cell and a second memory cell on opposite sides of the bit line;
 a second word line adjacent to the first memory cell and in electrical connection with the first word line;
 a third word line adjacent to the second memory cell;
 a fourth word line in electrical connection with the third word line;
 a third via connecting the first word line to a first metallization layer;
 a fourth via connecting the fourth word line to a second metallization layer, the fourth via and the third via being on opposite sides of the first memory cell;
 a third via connecting the first word line to a first metallization layer;
 a fourth via connecting the fourth word line to a second metallization layer, the fourth via and the third via being on opposite sides of the first memory cell; and a fifth via directly connecting the first metallization layer to the second metallization layer.

2. The semiconductor device of claim 1, wherein the first memory cell is located within a memory region adjacent to a logic region.

3. The semiconductor device of claim 1, wherein the first word line is located over first metallization layers.

4. The semiconductor device of claim 1, wherein the fifth via is in a logic region.

5. The semiconductor device of claim 1, wherein the a first memory cell comprises RRAM material.

6. The semiconductor device of claim 5, wherein the RRAM material is an "L"-shaped material.

7. The semiconductor device of claim 5, wherein the wherein the first memory cell comprises a selector material, wherein the selector material has a bar shape.

8. The semiconductor device of claim 5, wherein the RRAM material is a bar shaped RRAM material.

9. A semiconductor device comprising:
a bottom word line over a substrate;
a first bit line over the bottom word line;
RRAM material adjacent to the first bit line;
a selector material adjacent to the RRAM material;
a first word line on a first side of the first bit line, the first word line in electrical connection with the bottom word line;
a second word line on a second side of the first bit line opposite the first side;
a top word line over and in electrical connection with the second word line; and
a first hard mask in physical contact with the first bit line, wherein the first hard mask and the first bit line have aligned sidewalls.

10. The semiconductor device of claim 9, wherein the RRAM material has a bar shape.

11. The semiconductor device of claim 9, wherein the RRAM material has an "L" shape.

12. The semiconductor device of claim 11, wherein the selector material has a bar shape.

13. The semiconductor device of claim 9, wherein the top word line and the bottom word line are overlapped vertically.

14. The semiconductor device of claim 9, further comprising:
a first metallization layer between the bottom word line and the substrate; and
a second metallization layer over the top word line.

15. The semiconductor device of claim 14, further comprising a via extending directly between the first metallization layer and the second metallization layer.

16. A semiconductor device comprises:
a bit line disposed on a dielectric layer;
a first memory cell disposed on a first sidewall of the bit line;
a second memory cell disposed on a second sidewall of the bit line opposite the first sidewall;
a first word line disposed on the dielectric layer, wherein the first memory cell is disposed between the first sidewall of the bit line and a sidewall of the first word line;
a second word line disposed on the dielectric layer, wherein the second memory cell is disposed between the second sidewall of the bit line and a sidewall of the second word line;
a top word line disposed over the bit line and electrically connected to the first word line;
a bottom word line disposed under the bit line and electrically connected to the second word line; and
a first hard mask in physical contact with the bit line, wherein the first hard mask and the bit line have aligned sidewalls.

17. The semiconductor device of claim 16, wherein the first memory cell comprises a bar shaped RRAM material.

18. The semiconductor device of claim 16, wherein the first memory cell comprises an "L" shaped RRAM material.

19. The semiconductor device of claim 16, wherein the first memory cell comprises an "L" shaped RRAM material.

20. The semiconductor device of claim 16, wherein the first memory cell is located within a memory region adjacent to a logic region.

* * * * *